United States Patent
Linton et al.

(10) Patent No.: US 11,866,598 B2
(45) Date of Patent: *Jan. 9, 2024

(54) COMPOSITIONS AND METHODS INCLUDING DEPOSITING NANOMATERIAL

(71) Applicant: SAMSUNG ELECTRONICS CO., LTD., Suwon-si (KR)

(72) Inventors: John R. Linton, Concord, MA (US); Peter T. Kazlas, Sudbury, MA (US); Craig Breen, Somerville, MA (US); Seth Coe-Sullivan, Redondo Beach, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 95 days.

This patent is subject to a terminal disclaimer.

(21) Appl. No.: 17/568,204

(22) Filed: Jan. 4, 2022

(65) Prior Publication Data

US 2022/0127483 A1 Apr. 28, 2022

Related U.S. Application Data

(63) Continuation of application No. 16/440,322, filed on Jun. 13, 2019, now Pat. No. 11,472,979, which is a
(Continued)

(51) Int. Cl.
*C09D 11/52* (2014.01)
*B41J 2/21* (2006.01)
(Continued)

(52) U.S. Cl.
CPC ............. *C09D 11/52* (2013.01); *B41J 2/2107* (2013.01); *C09D 7/61* (2018.01); *C09D 7/62* (2018.01);
(Continued)

(58) Field of Classification Search
CPC . C09D 11/52; C09D 7/61; C09D 7/62; C09D 7/68; C09D 7/70; C09D 11/00;
(Continued)

(56) References Cited

U.S. PATENT DOCUMENTS

| | | |
|---|---|---|
| 3,248,588 A | 4/1966 | Blazek et al. |
| 3,510,732 A | 5/1970 | Amans et al. |

(Continued)

FOREIGN PATENT DOCUMENTS

| | | |
|---|---|---|
| JP | 4238304 | 3/1994 |
| JP | H-09304623 | 11/1997 |

(Continued)

OTHER PUBLICATIONS

Surface tension values of some common test liquids for surface energy analysis; pp. 1-4; www.surface-tension.de (Year: 2017).
(Continued)

*Primary Examiner* — Manish S Shah
(74) *Attorney, Agent, or Firm* — CANTOR COLBURN LLP

(57) ABSTRACT

An ink composition including a nanomaterial and a liquid vehicle, wherein the liquid vehicle includes a composition including one or more functional groups that are capable of being cross-linked is disclosed. An ink composition including a nanomaterial, a liquid vehicle, and scatterers is also disclosed. An ink composition including a nanomaterial and a liquid vehicle, wherein the liquid vehicle includes a perfluorocompound is further disclosed. A method for inkjet printing an ink including nanomaterial and a liquid vehicle with a surface tension that is not greater than about 25 dyne/cm is disclosed. In certain preferred embodiments, the nanomaterial includes semiconductor nanocrystals. Devices prepared from inks and methods of the invention are also described.

30 Claims, 3 Drawing Sheets

Related U.S. Application Data continuation of application No. 15/730,906, filed on Oct. 12, 2017, now Pat. No. 11,214,701, which is a continuation of application No. 14/531,114, filed on Nov. 3, 2014, now Pat. No. 9,815,996, which is a continuation of application No. 12/655,074, filed on Dec. 22, 2009, now Pat. No. 8,876,272, which is a continuation of application No. PCT/US2008/007901, filed on Jun. 25, 2008.

(60) Provisional application No. 60/949,306, filed on Jul. 12, 2007, provisional application No. 60/946,090, filed on Jun. 25, 2007.

(51) Int. Cl.
| | |
|---|---|
| C09D 7/40 | (2018.01) |
| C09D 11/326 | (2014.01) |
| C09D 11/38 | (2014.01) |
| C09K 11/88 | (2006.01) |
| C09D 7/61 | (2018.01) |
| C09D 7/62 | (2018.01) |
| C09D 11/00 | (2014.01) |
| C09D 11/037 | (2014.01) |
| C09K 11/02 | (2006.01) |
| H01L 33/06 | (2010.01) |
| C08K 3/22 | (2006.01) |
| C08K 7/18 | (2006.01) |
| C08K 9/00 | (2006.01) |

(52) U.S. Cl.
CPC .............. *C09D 7/68* (2018.01); *C09D 7/70* (2018.01); *C09D 11/00* (2013.01); *C09D 11/037* (2013.01); *C09D 11/326* (2013.01); *C09D 11/38* (2013.01); *C09K 11/02* (2013.01); *C09K 11/883* (2013.01); *H01L 33/06* (2013.01); *C08K 3/22* (2013.01); *C08K 7/18* (2013.01); *C08K 9/00* (2013.01); *H01L 2933/0091* (2013.01); *Y10T 29/49401* (2015.01)

(58) Field of Classification Search
CPC ..... C09D 11/037; C09D 11/326; C09D 11/38; C09D 11/36; C09D 11/40; C09D 11/30; C09D 11/32; C09D 11/322; C09D 11/324; C09D 11/328; C09D 11/101; C09D 11/102; C09D 11/005; C09D 11/54; C09D 11/106; B41J 2/2107; B41J 2/01; B41J 2/211; B41J 2/1433; B41J 2/17; B41J 2/17593; B41J 2/1755; B41J 2/2114; B41J 2/2117; B41J 2/2056; B41J 2/21; B41J 2/0057; B41J 3/60; B41J 2002/012; B41J 2/04598; B41J 2/04588; B41J 2/04595; B41J 2/04586; B41J 2/14274; B41J 2/1623; B41J 2202/00; B41J 2202/03; B41J 2/14201; B41J 2/045; B41J 11/0015; B41J 11/002; B41J 2/04581; B41J 2/055; B41J 2/16538; B41J 2002/16502; B41J 29/02; B41J 2/17513; B41J 2/17509; B41J 29/13; B41J 2/17553; B41J 2/1606; B41J 2/1642; B41J 2/1609; B41J 2/164; B41J 2/162; B41J 2/161; B41J 2/19; B41J 15/04; C09K 11/02; C09K 11/883; H01L 33/06; H01L 2933/0091; C08K 3/22; C08K 7/18; C08K 9/00; Y10T 29/49401; B41M 5/0011; B41M 5/0017; B41M 5/0023; B41M 5/0047; B41M 7/00; B41M 7/0072; B41M 5/52; B41M 5/5218; B41M 5/5227

See application file for complete search history.

(56) References Cited

U.S. PATENT DOCUMENTS

| | | |
|---|---|---|
| 3,774,086 A | 11/1973 | Vincent, Jr. |
| 3,825,792 A | 7/1974 | Rokosz et al. |
| 3,875,456 A | 4/1975 | Kano et al. |
| 4,035,686 A | 7/1977 | Fleming |
| 4,082,889 A | 4/1978 | Distefano |
| 4,130,343 A | 12/1978 | Miller et al. |
| 4,366,407 A | 12/1982 | Walsh |
| 4,377,750 A | 3/1983 | Pape et al. |
| 4,382,272 A | 5/1983 | Quella et al. |
| 4,608,301 A | 8/1986 | Ishizuka et al. |
| 4,719,386 A | 1/1988 | Toho |
| 4,766,526 A | 8/1988 | Morimoto et al. |
| 4,772,885 A | 9/1988 | Uehara et al. |
| 4,780,752 A | 10/1988 | Angerstein et al. |
| 4,820,016 A | 4/1989 | Cohen et al. |
| 4,902,567 A | 2/1990 | Eilersten et al. |
| 4,929,053 A | 5/1990 | Muller-Stute et al. |
| 4,931,692 A | 6/1990 | Tagaki et al. |
| 5,064,718 A | 11/1991 | Buscall et al. |
| 5,077,147 A | 12/1991 | Tanaka et al. |
| 5,208,462 A | 5/1993 | O'Conner et al. |
| 5,260,957 A | 11/1993 | Hakimi et al. |
| 5,293,050 A | 3/1994 | Chapple-Sokol et al. |
| 5,294,870 A | 3/1994 | Tang et al. |
| 5,354,707 A | 10/1994 | Chapple-Sokol et al. |
| 5,422,489 A | 6/1995 | Bhargava |
| 5,434,878 A | 7/1995 | Lawandy |
| 5,442,254 A | 8/1995 | Jaskie |
| 5,448,582 A | 9/1995 | Lawandy |
| 5,455,489 A | 10/1995 | Bhargava |
| 5,470,910 A | 11/1995 | Spanhel et al. |
| 5,482,890 A | 1/1996 | Liu et al. |
| 5,504,661 A | 4/1996 | Szpak |
| 5,527,386 A | 6/1996 | Statz |
| 5,534,056 A | 7/1996 | Kuehnle et al. |
| 5,537,000 A | 7/1996 | Alivisatos et al. |
| 5,586,879 A | 12/1996 | Szpak |
| 5,599,897 A | 2/1997 | Nishiguchi et al. |
| 5,677,545 A | 10/1997 | Shi et al. |
| 5,881,200 A | 3/1999 | Burt |
| 5,882,779 A | 3/1999 | Lawandy |
| 6,066,861 A | 5/2000 | Hohn et al. |
| 6,151,347 A | 11/2000 | Noel et al. |
| 6,239,449 B1 | 5/2001 | Fafard et al. |
| 6,259,506 B1 | 7/2001 | Lawandy |
| 6,294,401 B1 | 9/2001 | Jacobson et al. |
| 6,319,426 B1 | 11/2001 | Bawendi et al. |
| 6,322,901 B1 | 11/2001 | Bawendi et al. |
| 6,464,898 B1 | 10/2002 | Tomoike |
| 6,515,314 B1 | 2/2003 | Duggal et al. |
| 6,576,155 B1 | 6/2003 | Barbera-Guillem ... C09D 11/50 106/31.64 |
| 6,576,291 B2 | 6/2003 | Bawendi et al. |
| 6,608,439 B1 | 8/2003 | Sokolik et al. |
| 6,650,044 B1 | 11/2003 | Lowery |
| 6,682,189 B2 | 1/2004 | May et al. |
| 6,703,781 B2 | 3/2004 | Zovko |
| 6,714,711 B1 | 3/2004 | Lieberman et al. |
| 6,734,465 B1 | 5/2004 | Taskar et al. |
| 6,737,287 B1 | 5/2004 | Furuse et al. |
| 6,791,259 B1 | 9/2004 | Stokes et al. |
| 6,801,270 B2 | 10/2004 | Faris et al. |
| 6,803,719 B1 | 10/2004 | Miller et al. |
| 6,819,692 B2 | 11/2004 | Klimov et al. |
| 6,876,796 B2 | 4/2005 | Garito et al. |
| 6,890,078 B2 | 5/2005 | Koide |
| 6,903,505 B2 | 6/2005 | McNulty et al. |
| 6,913,830 B2 | 7/2005 | Decker et al. |
| 6,957,608 B1 | 10/2005 | Hubert et al. |
| 6,997,539 B2 | 2/2006 | Hoisington et al. |

(56) References Cited

U.S. PATENT DOCUMENTS

| | | |
|---|---|---|
| 7,008,559 B2 | 3/2006 | Chen |
| 7,011,396 B2 | 3/2006 | Moynihan et al. |
| 7,045,825 B2 | 5/2006 | Kahen et al. |
| 7,045,956 B2 | 5/2006 | Braune et al. |
| 7,065,285 B2 | 6/2006 | Chen et al. |
| 7,132,297 B2 | 11/2006 | Griglione et al. |
| 7,160,613 B2 | 1/2007 | Bawendi et al. |
| 7,166,010 B2 | 1/2007 | Lamansky et al. |
| 7,232,771 B2 | 6/2007 | Jacobs et al. |
| 7,253,452 B2 | 8/2007 | Steckel et al. |
| 7,273,309 B2 | 9/2007 | Ford et al. |
| 7,279,716 B2 | 10/2007 | Chen |
| 7,279,832 B2 | 10/2007 | Thurk et al. |
| 7,294,861 B2 | 11/2007 | Schardt et al. |
| 7,321,193 B2 | 1/2008 | Antoniadis et al. |
| 7,326,365 B2 | 2/2008 | Bawendi et al. |
| 7,326,908 B2 | 2/2008 | Sargent et al. |
| 7,332,211 B1 | 2/2008 | Bulovic et al. |
| 7,350,933 B2 | 4/2008 | Ng et al. |
| 7,361,413 B2 | 4/2008 | Kinlen |
| 7,374,807 B2 | 5/2008 | Parce et al. |
| 7,390,568 B2 | 6/2008 | Kim et al. |
| 7,393,618 B2 | 7/2008 | Ioku et al. |
| 7,420,323 B2 | 9/2008 | Krummacher |
| 7,430,355 B2 | 9/2008 | Heikenfeld et al. |
| 7,462,502 B2 | 12/2008 | Paolini et al. |
| 7,473,922 B2 | 1/2009 | Uchiyama et al. |
| 7,481,562 B2 | 1/2009 | Chua et al. |
| 7,495,383 B2 | 2/2009 | Chua et al. |
| 7,497,581 B2 | 3/2009 | Beeson et al. |
| 7,513,669 B2 | 4/2009 | Chua et al. |
| 7,560,747 B2 | 7/2009 | Cok |
| 7,560,859 B2 | 7/2009 | Saito et al. |
| 7,564,067 B2 | 7/2009 | Cok |
| 7,595,508 B2 | 9/2009 | Otsubo et al. |
| 7,679,102 B2 | 3/2010 | Chik et al. |
| 7,710,026 B2 | 5/2010 | Cok et al. |
| 7,722,422 B2 | 5/2010 | Cok |
| 7,723,744 B2 | 5/2010 | Gillies et al. |
| 7,732,237 B2 | 6/2010 | Xie |
| 7,791,271 B2 | 9/2010 | Cok et al. |
| 7,791,561 B2 | 9/2010 | Hajjar et al. |
| 7,799,586 B2 | 9/2010 | Leung et al. |
| 7,880,377 B2 | 2/2011 | Orita et al. |
| 7,897,653 B2 | 3/2011 | Iftime et al. |
| 7,902,748 B2 | 3/2011 | Cok |
| 8,044,382 B2 | 10/2011 | Yokoyama et al. |
| 8,089,061 B2 | 1/2012 | Kobayashi et al. |
| 8,120,239 B2 | 2/2012 | Cheon et al. |
| 8,128,249 B2 | 3/2012 | Skipor et al. |
| 8,128,272 B2 | 3/2012 | Fine et al. |
| 8,159,131 B2 | 4/2012 | Helbing |
| 8,264,777 B2 | 9/2012 | Skipor et al. |
| 8,330,348 B2 | 12/2012 | Berben et al. |
| 8,405,063 B2 | 3/2013 | Kazlas et al. |
| 8,445,064 B2 | 5/2013 | Chang et al. |
| 8,642,977 B2 | 2/2014 | Comerford et al. |
| 8,718,437 B2 | 5/2014 | Coe-Sullivan et al. |
| 8,876,272 B2 | 11/2014 | Linton et al. |
| 9,054,329 B2 | 6/2015 | Coe-Sullivan et al. |
| 9,212,056 B2 | 12/2015 | Breen et al. |
| 9,297,092 B2 | 3/2016 | Breen et al. |
| 9,303,153 B2* | 4/2016 | Nick ................ C09D 5/24 |
| 9,887,316 B2* | 2/2018 | Breen ............... H01L 33/04 |
| 11,214,701 B2* | 1/2022 | Linton .............. B41J 2/2107 |
| 2001/0001207 A1 | 5/2001 | Shimizu et al. |
| 2001/0028055 A1 | 10/2001 | Fafard et al. |
| 2002/0053359 A1 | 5/2002 | Harman et al. |
| 2002/0071948 A1 | 6/2002 | Duff et al. |
| 2002/0127224 A1 | 9/2002 | Chen et al. |
| 2002/0157574 A1 | 10/2002 | Weitzel et al. |
| 2002/0186921 A1 | 12/2002 | Schumacher et al. |
| 2002/0197764 A1 | 12/2002 | Uemura et al. |
| 2003/0010987 A1 | 1/2003 | Banin et al. |
| 2003/0030706 A1 | 2/2003 | Jagannathan et al. |
| 2003/0034486 A1 | 2/2003 | Korgel |
| 2003/0048346 A1 | 3/2003 | Chow |
| 2003/0151700 A1 | 8/2003 | Carter et al. |
| 2003/0156425 A1 | 8/2003 | Turnbull et al. |
| 2003/0160260 A1 | 8/2003 | Hirai et al. |
| 2003/0164505 A1 | 9/2003 | Streubel et al. |
| 2003/0177941 A1 | 9/2003 | Barbera-Guillem ... C09D 11/50 106/31.15 |
| 2003/0227249 A1 | 12/2003 | Mueller et al. |
| 2003/0230970 A1 | 12/2003 | Steckl et al. |
| 2004/0004433 A1 | 1/2004 | Lamansky et al. |
| 2004/0007169 A1 | 1/2004 | Ohtsu et al. |
| 2004/0012958 A1 | 1/2004 | Hashimoto et al. |
| 2004/0023010 A1 | 2/2004 | Bulovic et al. |
| 2004/0131789 A1 | 7/2004 | Brown |
| 2004/0135495 A1 | 7/2004 | Wu et al. |
| 2004/0233139 A1 | 11/2004 | Asano et al. |
| 2004/0245912 A1 | 12/2004 | Thurk et al. |
| 2004/0259363 A1 | 12/2004 | Bawendi et al. |
| 2005/0012076 A1 | 1/2005 | Morioka |
| 2005/0051777 A1 | 3/2005 | Hill |
| 2005/0058415 A1 | 3/2005 | Lee et al. |
| 2005/0058416 A1 | 3/2005 | Hoon Lee et al. |
| 2005/0062395 A1 | 3/2005 | Takahashi et al. |
| 2005/0072989 A1 | 4/2005 | Bawendi et al. |
| 2005/0088079 A1 | 4/2005 | Daniels |
| 2005/0088380 A1 | 4/2005 | Bulovic et al. |
| 2005/0093422 A1 | 5/2005 | Wang et al. |
| 2005/0093430 A1 | 5/2005 | Betson et al. |
| 2005/0098787 A1 | 5/2005 | Andrews |
| 2005/0116621 A1 | 6/2005 | Bellman et al. |
| 2005/0134723 A1 | 6/2005 | Lee et al. |
| 2005/0135079 A1 | 6/2005 | Yin Chua et al. |
| 2005/0139852 A1 | 6/2005 | Chen et al. |
| 2005/0180680 A1 | 8/2005 | Kong |
| 2005/0212405 A1 | 9/2005 | Negley |
| 2005/0214967 A1 | 9/2005 | Scher et al. |
| 2005/0227063 A1 | 10/2005 | Lawandy |
| 2005/0236556 A1 | 10/2005 | Sargent et al. |
| 2005/0261400 A1 | 11/2005 | Yang et al. |
| 2005/0265404 A1 | 12/2005 | Ashdown |
| 2005/0271548 A1 | 12/2005 | Yang et al. |
| 2005/0272159 A1 | 12/2005 | Ismagilov et al. |
| 2005/0274944 A1 | 12/2005 | Jang |
| 2005/0275615 A1 | 12/2005 | Kahen et al. |
| 2005/0279949 A1 | 12/2005 | Oldham et al. |
| 2006/0001036 A1 | 1/2006 | Jacob et al. |
| 2006/0002101 A1 | 1/2006 | Wheatley |
| 2006/0003097 A1 | 1/2006 | Andres et al. |
| 2006/0003114 A1 | 1/2006 | Enlow et al. |
| 2006/0003156 A1 | 1/2006 | Masutani |
| 2006/0011923 A1 | 1/2006 | Eisert et al. |
| 2006/0024525 A1 | 2/2006 | Jeong et al. |
| 2006/0034065 A1 | 2/2006 | Thurk |
| 2006/0043361 A1 | 3/2006 | Lee et al. |
| 2006/0057460 A1 | 3/2006 | Matthias et al. |
| 2006/0063029 A1 | 3/2006 | Jang et al. |
| 2006/0063289 A1 | 3/2006 | Negley et al. |
| 2006/0065902 A1 | 3/2006 | Todori et al. |
| 2006/0066210 A1 | 3/2006 | Ng et al. |
| 2006/0068154 A1 | 3/2006 | Parce et al. |
| 2006/0081862 A1 | 4/2006 | Chua et al. |
| 2006/0097264 A1 | 5/2006 | Kim et al. |
| 2006/0105483 A1 | 5/2006 | Leatherdale et al. |
| 2006/0109682 A1 | 5/2006 | Ko et al. |
| 2006/0144290 A1 | 7/2006 | Polk et al. |
| 2006/0145599 A1 | 7/2006 | Stegamat et al. |
| 2006/0146565 A1 | 7/2006 | Lee |
| 2006/0147703 A1 | 7/2006 | Walker et al. |
| 2006/0152150 A1 | 7/2006 | Boerner et al. |
| 2006/0157686 A1 | 7/2006 | Jang et al. |
| 2006/0157717 A1 | 7/2006 | Nagai et al. |
| 2006/0157720 A1 | 7/2006 | Bawendi et al. |
| 2006/0169971 A1 | 8/2006 | Cho et al. |
| 2006/0196375 A1 | 9/2006 | Coe-Sullivan et al. |
| 2006/0197437 A1 | 9/2006 | Krummacher et al. |
| 2006/0199886 A1 | 9/2006 | Ryang |
| 2006/0202219 A1 | 9/2006 | Ohashi et al. |

(56) References Cited

U.S. PATENT DOCUMENTS

| | | |
|---|---|---|
| 2006/0202616 A1 | 9/2006 | Gong .................. H01L 51/5048 313/506 |
| 2006/0204676 A1 | 9/2006 | Jones et al. |
| 2006/0204679 A1 | 9/2006 | Jones et al. |
| 2006/0210726 A1 | 9/2006 | Jones et al. |
| 2006/0214903 A1 | 9/2006 | Kurosaka |
| 2006/0215958 A1 | 9/2006 | Yeo et al. |
| 2006/0221021 A1 | 10/2006 | Hajjar et al. |
| 2006/0227546 A1 | 10/2006 | Yeo et al. |
| 2006/0232725 A1 | 10/2006 | Chua et al. |
| 2006/0236918 A1 | 10/2006 | Jun ..................... B82Y 20/00 117/68 |
| 2006/0238103 A1 | 10/2006 | Choi et al. |
| 2006/0238671 A1 | 10/2006 | Kim et al. |
| 2006/0244367 A1 | 11/2006 | Im et al. |
| 2006/0245710 A1 | 11/2006 | Borrelli et al. |
| 2006/0255711 A1 | 11/2006 | Dejima et al. |
| 2006/0266640 A1 | 11/2006 | Halsey et al. |
| 2006/0274226 A1 | 12/2006 | Im et al. |
| 2006/0279296 A1 | 12/2006 | Lee et al. |
| 2006/0293409 A1 | 12/2006 | Sanchez et al. |
| 2007/0012928 A1 | 1/2007 | Peng et al. |
| 2007/0012941 A1 | 1/2007 | Cheon |
| 2007/0013996 A1 | 1/2007 | Verma |
| 2007/0014318 A1 | 1/2007 | Hajjar et al. |
| 2007/0018102 A1 | 1/2007 | Braune et al. |
| 2007/0018558 A1 | 1/2007 | Chua et al. |
| 2007/0034833 A1 | 2/2007 | Parce et al. |
| 2007/0036510 A1 | 2/2007 | Ingman et al. |
| 2007/0036962 A1 | 2/2007 | Sasaki et al. |
| 2007/0045777 A1 | 3/2007 | Gillies et al. |
| 2007/0046649 A1 | 3/2007 | Reiner et al. |
| 2007/0053208 A1 | 3/2007 | Justel et al. |
| 2007/0069288 A1 | 3/2007 | Takeda et al. |
| 2007/0077594 A1 | 4/2007 | Hikmet et al. |
| 2007/0079927 A1 | 4/2007 | Lamansky et al. |
| 2007/0085092 A1 | 4/2007 | Chen et al. |
| 2007/0087197 A1 | 4/2007 | Jang et al. |
| 2007/0090755 A1 | 4/2007 | Eida et al. |
| 2007/0096078 A1 | 5/2007 | Lee et al. |
| 2007/0096634 A1 | 5/2007 | Krummacher et al. |
| 2007/0103068 A1 | 5/2007 | Bawendi et al. |
| 2007/0108888 A1 | 5/2007 | Chen et al. |
| 2007/0112101 A1 | 5/2007 | Choi et al. |
| 2007/0112118 A1 | 5/2007 | Park et al. |
| 2007/0115995 A1 | 5/2007 | Kim et al. |
| 2007/0119951 A1 | 5/2007 | Auslander ........ G06K 19/06046 235/491 |
| 2007/0121129 A1 | 5/2007 | Eida et al. |
| 2007/0131905 A1 | 6/2007 | Sato et al. |
| 2007/0145350 A1 | 6/2007 | Kobori |
| 2007/0154735 A1 | 7/2007 | Nakayama |
| 2007/0158668 A1 | 7/2007 | Tarsa et al. |
| 2007/0164661 A1 | 7/2007 | Kuma |
| 2007/0170418 A1 | 7/2007 | Bowers et al. |
| 2007/0170447 A1 | 7/2007 | Negley et al. |
| 2007/0177380 A1 | 8/2007 | Schultz et al. |
| 2007/0190675 A1 | 8/2007 | Yamazaki et al. |
| 2007/0200492 A1 | 8/2007 | Cok et al. |
| 2007/0223219 A1 | 9/2007 | Medendorp et al. |
| 2007/0235751 A1 | 10/2007 | Radkov et al. |
| 2007/0241661 A1 | 10/2007 | Yin |
| 2007/0246734 A1 | 10/2007 | Lee et al. |
| 2007/0247061 A1 | 10/2007 | Adamovich et al. |
| 2007/0257608 A1 | 11/2007 | Tyan et al. |
| 2007/0263408 A1 | 11/2007 | Chua et al. |
| 2007/0281140 A1 | 12/2007 | Haubrich et al. |
| 2007/0298160 A1 | 12/2007 | Jang et al. |
| 2008/0001124 A1 | 1/2008 | Hachiya et al. |
| 2008/0001167 A1 | 1/2008 | Coe-Sullivan et al. |
| 2008/0001528 A1 | 1/2008 | Eida |
| 2008/0007156 A1 | 1/2008 | Gibson et al. |
| 2008/0012031 A1 | 1/2008 | Jang et al. |
| 2008/0012471 A1 | 1/2008 | Cok |
| 2008/0029760 A1 | 2/2008 | Jun et al. |
| 2008/0057342 A1 | 3/2008 | Sekiya |
| 2008/0070153 A1 | 3/2008 | Ioku et al. |
| 2008/0074050 A1 | 3/2008 | Chen et al. |
| 2008/0083907 A1 | 4/2008 | Hayes et al. ............. 252/301.36 |
| 2008/0116784 A1 | 5/2008 | Krummacher et al. |
| 2008/0135914 A1 | 6/2008 | Krishna et al. |
| 2008/0144333 A1 | 6/2008 | Gourlay |
| 2008/0165235 A1 | 7/2008 | Rolley et al. |
| 2008/0169753 A1 | 7/2008 | Skipor et al. |
| 2008/0172197 A1 | 7/2008 | Skipor et al. |
| 2008/0173886 A1 | 7/2008 | Cheon et al. |
| 2008/0180020 A1 | 7/2008 | Cok |
| 2008/0213919 A1 | 9/2008 | Naasani ............... G01N 33/588 436/525 |
| 2008/0218068 A1 | 9/2008 | Cok |
| 2008/0237540 A1 | 10/2008 | Dubrow |
| 2008/0237611 A1 | 10/2008 | Cok et al. |
| 2008/0246017 A1 | 10/2008 | Gillies et al. |
| 2008/0254210 A1 | 10/2008 | Lai et al. |
| 2008/0273562 A1 | 11/2008 | Hasegawa et al. |
| 2008/0276817 A1 | 11/2008 | Hinch et al. |
| 2008/0277626 A1 | 11/2008 | Yang ..................... C09D 11/30 252/301.36 |
| 2008/0278063 A1 | 11/2008 | Cok |
| 2008/0297028 A1 | 12/2008 | Kane et al. |
| 2008/0297029 A1 | 12/2008 | Cok |
| 2008/0308825 A1 | 12/2008 | Chakraborty et al. |
| 2009/0001385 A1 | 1/2009 | Skipor et al. |
| 2009/0002806 A1 | 1/2009 | Skipor et al. |
| 2009/0017268 A1 | 1/2009 | Hachiya et al. |
| 2009/0021148 A1 | 1/2009 | Hachiya et al. |
| 2009/0034292 A1 | 2/2009 | Pokrovskiy et al. |
| 2009/0050907 A1 | 2/2009 | Yuan et al. |
| 2009/0057662 A1 | 3/2009 | Brazis et al. |
| 2009/0059554 A1 | 3/2009 | Skipor et al. |
| 2009/0114932 A1 | 5/2009 | Chou |
| 2009/0152567 A1 | 6/2009 | Comerford et al. |
| 2009/0162011 A1 | 6/2009 | Coe-Sullivan et al. |
| 2009/0173957 A1 | 7/2009 | Brunner et al. |
| 2009/0174022 A1 | 7/2009 | Coe-Sullivan et al. |
| 2009/0181478 A1 | 7/2009 | Cox et al. |
| 2009/0196160 A1 | 8/2009 | Crombach et al. |
| 2009/0201577 A1 | 8/2009 | Laplante et al. |
| 2009/0206320 A1 | 8/2009 | Chua et al. |
| 2009/0208753 A1 | 8/2009 | Coe-Sullivan et al. |
| 2009/0212695 A1 | 8/2009 | Kim et al. |
| 2009/0215208 A1 | 8/2009 | Coe-Sullivan et al. |
| 2009/0215209 A1 | 8/2009 | Anc et al. |
| 2009/0236621 A1 | 9/2009 | Chakraborty |
| 2009/0278141 A1 | 11/2009 | Coe-Sullivan et al. |
| 2009/0280586 A1 | 11/2009 | Coe-Sullivan |
| 2009/0283742 A1 | 11/2009 | Coe-Sullivan et al. |
| 2009/0283778 A1 | 11/2009 | Coe-Sullivan et al. |
| 2009/0286338 A1 | 11/2009 | Coe-Sullivan et al. |
| 2009/0321755 A1 | 12/2009 | Jang et al. |
| 2010/0002414 A1 | 1/2010 | Meir et al. |
| 2010/0014799 A1 | 1/2010 | Bulovic et al. |
| 2010/0025595 A1 | 2/2010 | Bawendi et al. |
| 2010/0044635 A1 | 2/2010 | Breen et al. |
| 2010/0044636 A1 | 2/2010 | Ramprasad et al. |
| 2010/0051870 A1 | 3/2010 | Ramprasad |
| 2010/0051898 A1 | 3/2010 | Kim et al. |
| 2010/0052512 A1 | 3/2010 | Clough et al. |
| 2010/0067214 A1 | 3/2010 | Coe-Sullivan et al. |
| 2010/0068468 A1 | 3/2010 | Coe-Sullivan et al. |
| 2010/0086701 A1 | 4/2010 | Iftime et al. |
| 2010/0090597 A1 | 4/2010 | Werners et al. |
| 2010/0103648 A1 | 4/2010 | Kim et al. |
| 2010/0110728 A1 | 5/2010 | Dubrow et al. |
| 2010/0113813 A1 | 5/2010 | Pickett et al. |
| 2010/0120182 A1 | 5/2010 | Kim |
| 2010/0123155 A1 | 5/2010 | Pickett et al. |
| 2010/0132770 A1 | 6/2010 | Beatty et al. |
| 2010/0134520 A1 | 6/2010 | Coe-Sullivan et al. |
| 2010/0142182 A1 | 6/2010 | Van Woudenberg et al. |
| 2010/0142183 A1 | 6/2010 | Lerenius |
| 2010/0144231 A1 | 6/2010 | Landry et al. |
| 2010/0149814 A1 | 6/2010 | Zhai et al. |
| 2010/0155749 A1 | 6/2010 | Chen et al. |

(56) References Cited

U.S. PATENT DOCUMENTS

| | | |
|---|---|---|
| 2010/0165599 A1 | 7/2010 | Allen |
| 2010/0167011 A1 | 7/2010 | Dubrow |
| 2010/0171136 A1 | 7/2010 | Sakai et al. |
| 2010/0172122 A1 | 7/2010 | Ramer et al. |
| 2010/0193806 A1 | 8/2010 | Byun |
| 2010/0208493 A1 | 8/2010 | Choi et al. |
| 2010/0243053 A1 | 9/2010 | Coe-Sullivan et al. |
| 2010/0246009 A1 | 9/2010 | Polley et al. |
| 2010/0258968 A1 | 10/2010 | Zu |
| 2010/0265307 A1 | 10/2010 | Linton et al. |
| 2010/0277059 A1 | 11/2010 | Rains, Jr. et al. |
| 2010/0283036 A1 | 11/2010 | Coe-Sullivan et al. |
| 2010/0283072 A1 | 11/2010 | Kazlas et al. |
| 2010/0301360 A1 | 12/2010 | Van De Ven et al. |
| 2011/0025224 A1 | 2/2011 | Wood et al. |
| 2011/0156071 A1 | 6/2011 | Cheng et al. |
| 2011/0182056 A1 | 7/2011 | Trottier et al. |
| 2011/0299001 A1 | 12/2011 | Banin et al. |
| 2012/0056289 A1 | 3/2012 | Tian et al. |
| 2012/0313075 A1* | 12/2012 | Linton ............... G02B 1/002 257/E33.011 |
| 2013/0164875 A1 | 6/2013 | Lamansky et al. |
| 2014/0068356 A1 | 3/2014 | Watanabe et al. |

FOREIGN PATENT DOCUMENTS

| | | | |
|---|---|---|---|
| JP | 2002091352 | | 3/2002 |
| JP | 2004071357 | A | 3/2004 |
| JP | 2004107572 | A | 4/2004 |
| JP | 2004133111 | A | 4/2004 |
| JP | 2005025970 | | 1/2005 |
| JP | 2005025970 | A | 1/2005 ............... H01J 9/02 |
| JP | 2005038768 | | 2/2005 |
| JP | 2005531915 | A | 10/2005 |
| JP | 2006504512 | A | 2/2006 |
| JP | 2006059723 | | 3/2006 |
| JP | 2006073202 | | 3/2006 |
| JP | 2006073869 | A | 3/2006 |
| JP | 2006186317 | | 7/2006 |
| JP | 2006278082 | | 10/2006 |
| JP | 2007103099 | | 4/2007 |
| JP | 2007103513 | | 4/2007 |
| JP | 2009514178 | A | 4/2009 |
| WO | 2003070816 | A1 | 8/2003 |
| WO | 2003079414 | A3 | 9/2003 |
| WO | 2006022123 | A1 | 3/2006 |
| WO | 2006104689 | A1 | 10/2006 |
| WO | 2006120895 | A1 | 11/2006 |
| WO | 2007002234 | A1 | 1/2007 |
| WO | 2007009010 | A2 | 1/2007 |
| WO | WO2007001438 | | 1/2007 |
| WO | WO2007006246 | A1 | 1/2007 |
| WO | 2007051499 | A1 | 5/2007 |
| WO | 2007136816 | A2 | 11/2007 |
| WO | 2008029633 | A1 | 8/2008 |
| WO | WO2009002512 | A1 | 12/2008 |
| WO | 2009011922 | A1 | 1/2009 |
| WO | 2009014707 | A2 | 1/2009 |
| WO | WO2009014590 | A2 | 1/2009 |
| WO | 2009137053 | A1 | 11/2009 |
| WO | 2009145813 | A1 | 12/2009 |
| WO | 2009151515 | A1 | 12/2009 |
| WO | 2010014205 | A1 | 2/2010 |
| WO | 2011020098 | A1 | 2/2011 |

OTHER PUBLICATIONS

Non-Final Office Action for U.S. Appl. No. 15/730,906 dated Dec. 13, 2019.
Adachi et al., High-efficiency red electrophosphorescence devices, Appl. Phys. Lett. 78, 1622 (2001).
Arango, Alexi Cosmos, Thesis of entitled "A Quantum Dot Heterojunction Photodetector" Submitted to the Department of Electrical Engineering and Computer Science, in partial fulfillment of the requirements for the degree of Masters of Science in Computer Science and Engineering at the Massachusetts Institute of Technology, Feb. 2005.
Bulovic et al., Semiconductors and Semimetals 64, 255 (2000).
Coe-Sullivan, et al., "Method for fabrication of saturated RGB quantum dot light emitting devices". Proc. of SPIE vol. 5739, pp. 108-115 (2005).
D'Andrade et al., "Organic Optoelectronic Materials, Processing, and Devices", MRS Fall Meeting, BB6.2 (2001).
Dabbousi et al., "(CdSe) ZnS Core-Shell Quantum Dots : Synthesis and Characterization of a Size Series of Highly Luminescent Nanocrystallites", J. Phys. Chem. 101, 9463 (1997).
Dirr et al., "Organic Light Emitting Diodes with Reduced Spectral and Spacial Halfwidths", Jpn. J. Appl. Phys. 37, 1457 (1998).
Dupont™ Ti-Pure® R-902+ (2006).
Huang, et al., "Bias-Induced Photoluminescence Quenching of Single Colloidal Quantum Dots Embedded in Organic Semiconductors", Nano Letters 2007 vol. 7, No. 12, pp. 3781-3786.
JP 2010-0514794 JP Office Action dated Jan. 8, 2013, which is the Japanese counterpart of parent U.S. Appl. No. 12/655,074, now U.S. Pat. No. 8876272).
JP 2010514795 final rejection dated Aug. 6, 2013 (JP-2010514795 is JP counterpart of related U.S. Appl. No. 12/283,609, now U.S. Pat. No. 8,718,347).
JP 2010514795 notice of rejection dated May 8, 2012 (JP-2010514795 is JP counterpart of related U.S. Appl. No. 12/283,609, now U.S. Pat. No. 8,718,347).
JP2013252719 1st office action dated Nov. 4, 2014. (JP2013252719 is a division of JP 2010514795).
Kim, et al., "Contact Printing of Quantum Dot Light-emitting Devices", NANO Letters, 2008, vol. 8, No. 12, 4513-4517.
Kirstein, et al., "Herringbone Structures In Two- Dimensional Single Crystals of Cyanine Dyes. I. Detailed Structure Analysis Using Electron Diffraction", J. Chem. Phys. 103(2) Jul. 1995, pp. 818 et seq.
Kirstein, et al., "Herringbone Structures In Two-Dimensional Single Crystals of Cyanine Dyes. II. Optical Properties", J. Chem. Phys. 103(2) Jul. 1995, pp. 826 et seq.
KR10-20107001541 Preliminary Rejection dated Nov. 26, 2014. KR10-20107001541 is the Korean counterpart of parent U.S. Appl. No. 12/655,074, now U.S. Pat. No. 8,876,272).
KR10-20107001541 $2^d$ Preliminary Rejection dated Sep. 25, 2015. KR10-20107001541 is the Korean counterpart of parent U.S. Appl. No. 12/655,074, now U.S. Pat. No. 8,876,272.
KR10-2010-7001542 Preliminary Rejection dated Sep. 5, 2014, now KR Patent No. 10-1560846 issued Oct. 8, 2015. (KR10-2010-7001542 counterpart of related U.S. Appl. No. 12/283,609, now U.S. Pat. No. 8,718,347).
Lin, et al., "Formation of Long-range-ordered Nanocrsytal Superlattices on Silicon Nitride Substrates", J. Phys. Chem. B 2001, 105, 3353-3357.
Maenosono, Shinya; et al., "Overview of Nanoparticle Array Formation by Wet Coating", Journal of Nanoparticle Research 5:5-15, 2003.
Mishra, et al. "Cyanines During the 1990s: A Review", Chem. Rev. 2000, 100, 1973-2011.
Moeller, G., et al., "Quantum-dot light-emitting devices for displays", Information Display, Feb. 2006, pp. 2-6.
Murray, C., "Synthesis and Characterization of II-VI Quantum Dots and Their Assembly into 3-D Quantum Dot Superlattices", Thesis, Massachusetts Institute of Technology, Sep. 1995.
Murray, C., et al., "Synthesis and Characterization of Nearly Monodisperse CdE (E = S, Se, Te) Semiconductor Nanocrystallites" (Nov. 1993), J. Am. Chem. Soc., 115, pp. 8706-8715.
PCT Search Report and Written Opinion dated Jan. 21, 2009 for grandparent International Application No. PCT/US2008/07901.
Peyratout, et al., "Aggregation of Thiacyanine Derivatives On Polyelectrolytes", Phys. Chem. Chem. Phys., 2002, 4, 3032-3039.
Santhanam, et al., "Self-Assembly of Uniform Monolayer Arrays of Nanoparticles", Langmuir, 19, 7881-7887, (2003).
Sargent, Edward H. "Infrared Quantum Dots" Adv. Mater. 2005, 17, No. 5, Mar. 8.

(56) References Cited

OTHER PUBLICATIONS

Schlamp, et al., "Improved efficiencies in light emitting diodes made with CdSe(CdS) core/shell type nanocrystals and a semiconducting polymer", J. Appl. Phys., 82, 5837-5842, (1997).
U.S. Appl. No. 12/283,609 final Office Action dated Apr. 15, 2010, a related application, now U.S. Pat. No. 8,718,437.
U.S. Appl. No. 12/283,609 non-final Office Action dated Mar. 7, 2011, a related application, now U.S. Pat. No. 8,718,437.
U.S. Appl. No. 12/283,609 non-final Office Action dated Jul. 28, 2009, a related application, now U.S. Pat. No. 8,718,437.
U.S. Appl. No. 12/655,074 final Offie Action dated Oct. 12, 2011. (U.S. Appl. No. 12/655,074, now U.S. Pat. No. 8,876,272, the parent of the present application.).
Yamasaki et al., "Organic light-emitting device with an ordered monolayer of silica microspheres as a scattering medium", Appl. Phys. Lett. 76, 1243 (2000).

\* cited by examiner

COMPOSITIONS AND METHODS INCLUDING DEPOSITING NANOMATERIAL

CROSS-REFERENCE TO RELATED APPLICATION

This application is a continuation application of U.S. patent application Ser. No. 16/440,322, filed Jun. 13, 2019, which is a continuation application of Ser. No. 15/730,906, filed Oct. 12, 2017 and issued as U.S. Pat. No. 11,214,701 on Jan. 4, 2022, which is a continuation application of U.S. patent application Ser. No. 14/531,114, filed Nov. 3, 2014 and issued as U.S. Pat. No. 9,815,996 on Nov. 14, 2017, which is a continuation application of U.S. patent application Ser. No. 12/655,074, filed 22 Dec. 2009 and issued as U.S. Pat. No. 8,876,272 on Nov. 4, 2014, which is a continuation application of commonly owned International Application No. PCT/US2008/007901, filed 25 Jun. 2008, which was published in the English language as PCT Publication No. WO 2009/0014590 on 29 Jan. 2009. The PCT Application claims priority from commonly owned U.S. Application No. 60/946,090, filed 25 Jun. 2007, and U.S. Application No. 60/949,306, filed 12 Jul. 2007. The disclosures of each of the foregoing applications are hereby incorporated herein by reference in their entireties.

FIELD OF THE INVENTION

The present invention relates to the technical field of nanomaterials, including but not limited to, compositions including a nonmaterial and methods including depositing a nanomaterial or composition including a nanomaterial.

SUMMARY OF THE INVENTION

It has been recognized that it would be advantageous to develop improved compositions and methods for depositing a nonmaterial. Such methods and compositions are useful in fabricating devices and/or arrays of devices.

In accordance with one aspect of the invention, there is provided an ink composition comprising a nonmaterial and a liquid vehicle, wherein the liquid vehicle comprises a perfluorocompound. In certain most preferred embodiments, the liquid vehicle comprises Fluorinert FC-77, available from 3M.

In certain aspects and embodiments of the invention described herein, of an ink in accordance with the invention, the ink composition comprises a dispersion. For certain applications, it is desirable for the dispersion to be colloidal.

In certain embodiment, the ink can further include scatterers.

In certain embodiments, the liquid vehicle comprises a perfluorocompound including one or more functional groups that are capable of being cross-linked. In certain embodiments, the functional units can be cross-linked by UV treatment. In certain embodiments, the functional units can be cross-linked by thermal treatment. In certain embodiments, the functional units can be cross-linked by other cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle.

In certain embodiments, the nanomaterial comprises semiconductor nanocrystals. In certain preferred embodiments, the nanomaterial comprises semiconductor nanocrystals at least a portion of which include a fluorinated ligand attached to a surface thereof.

In accordance with one aspect of the invention, there is provided an ink composition comprising a nanomaterial and a liquid vehicle, wherein the liquid vehicle comprises a composition including one or more functional groups that are capable of being cross-linked. In certain embodiments, the functional units can be cross-linked by UV treatment. In certain embodiments, the functional units can be cross-linked by thermal treatment. In certain embodiments, the functional units can be cross-linked by other cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle.

In certain embodiments, the ink can further include scatterers.

In accordance with another aspect of the invention, there is provided an ink composition comprising a nanomaterial, a liquid vehicle, and scatterers.

Examples of scatterers (also referred to herein as scattering particles) include, without limitation, metal or metal oxide particles, air bubbles, and glass beads (solid or hollow). Other scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, and ZnO. Selection of the size and size distribution of the scatterers is readily determinable by those of ordinary skill in the art. The size and size distribution is preferably based upon the refractive index mismatch of the scattering particle and the host material in which it the scatterer is to be dispersed after removal of any liquid medium that may be present, and the preselected wavelength(s) to be scattered according to Rayleigh scattering theory. The surface of the scattering particle may further be treated to improve dispersability and stability in the host material. In one embodiment, the scattering particle comprises $TiO_2$ (R902+ from DuPont) of 0.2 µm particle size, in a concentration between 0.001% and 20% by weight. In certain preferred embodiments, the concentration range of the scatterers is between 0.1% and 10% by weight. In a certain more preferred embodiments, an ink includes a scatterer comprising $TiO_2$ at a concentration in a range from about 1% to about 5% by weight.

In certain aspects and embodiments of the inventions described herein, it is not necessary to have the nanomaterial particles (e.g., semiconductor nanocrystals) individually dispersed in the liquid vehicle. The nanomaterial particles (e.g., semiconductor nanocrystals) may be aggregated. In certain embodiments of the inventions described herein, the nanomaterial particles (e.g., semiconductor nanocrystals) may be included within or adsorbed onto polymer particles. In certain embodiments of the inventions described herein, the nanomaterial particles (e.g., semiconductor nanocrystals) may be included within or adsorbed onto a matrix. The matrix can be polymeric or non-polymeric.

In certain aspects and embodiments of the invention described herein, the nanomaterial comprises semiconductor nanocrystals.

Semiconductor nanocrystals possess characteristics and properties that make them particularly well-suited for use in a variety of devices and other end-use applications, including, but not limited to, light emitting devices, displays, photodetectors, nonvolatile random memory devices, solar cells, sensors, photovoltaic devices, etc.

In certain aspects and embodiments of the invention described herein, the nanomaterial comprises semiconductor nanocrystals wherein at least a portion of the semiconductor nanocrystals include one or more ligands attached to a surface thereof.

In certain aspects and embodiments of the invention described herein, an ink in accordance with an embodiment of the invention can further comprises a material capable of transporting charge. In certain embodiments, the material capable of transporting charge has a triplet energy which is at least greater than the bandgap of the semiconductor nanocrystals included in the ink. In certain embodiments, the material capable of transporting charge included in the ink is at least partially soluble in the liquid vehicle.

In certain aspects and embodiments of the invention described herein, an ink in accordance with an embodiment of the invention can further include a variety of components such as those typically used in inkjet liquid vehicles and inks, such as, but not limited to solvents, cosolvents, surfactants, biocides, buffers, viscosity modifiers, sequestering agents, colorants, stabilizing agents, humectants, fillers, extenders, water, and mixtures thereof.

In accordance with another aspect of the invention, there is provided a method for depositing an ink composition comprising a immaterial and a liquid vehicle having a surface tension less than about 25 dyne/cm. In certain embodiments, the liquid vehicle has a surface tension no greater than about 15 dyne/cm. Examples of liquid vehicles having a surface tension a vehicle less than about 25 dyne/cm include those in which organic materials typically used in fabricating various electronic devices (e.g., light-emitting devices, photodetectors, and other devices including semiconductor nanocrystals) are insoluble. Examples of such liquid vehicles include fluorinated solvents, such as perfluorodecalin, or the Fluorinert series of solvents sold by 3M. In creating inks from such solvents, the surface tension and viscosity may fail below those normally required for inkjet, e.g., 25 dyne/cm. Fluorinert FC-77, for example, has a surface tension of 13 dyne/cm and a viscosity of 1.3 cP.

A method for depositing an ink composition comprising a nanomaterial and a liquid vehicle having a surface tension less than about 25 dyne/cm from an inkjet system including an inkjet cartridge reservoir that feeds ink to art ink jet nozzle for printing, the method comprising creating a negative pressure relative to atmospheric pressure inside the inkjet cartridge reservoir which feeds the ink to an ink jet nozzle; and printing the ink. The method can more consistently inkjet-print inks made with these solvents with use of an inkjet system including an inkjet cartridge reservoir which feeds the ink to an ink jet nozzle. Creating a negative pressure (relative to atmospheric) inside an inkjet cartridge reservoir can achieve a jet that is more stable. In certain embodiments, this can be accomplished, for example, by placing the inkjet cartridge reservoir below the inkjet nozzle. Preferably, the inkjet cartridge reservoir is held by or positioned relative to the inkjet nozzle(s) such that the height of inkjet cartridge reservoir can be adjusted to obtain a slight negative pressure inside the cartridge reservoir. The method can facilitate inkjet printing an ink composition comprising a nanomaterial and a liquid vehicle having a surface tension less than about 25 dyne/cm without requiring the addition of surfactants or other ingredients.

The ability to inkjet print inks having a surface tension less than about 25 dyne/cm which include nanomaterials (e.g., semiconductor nanocrystals including ligands) without requiring the addition of separate surfactants and/or other additives, is advantageous in the manufacture of devices and other electronic structures in which such additional additives can have an adverse affect on the chemistry, optical, or electronic properties and/or performance thereof.

In certain embodiments, the ink is deposited onto a surface, including, but not limited to the substrates and other surfaces described herein.

In certain embodiments, the nanomaterial comprises inorganic nanoparticles capable of emitting light.

In certain embodiments, the nanomaterial comprises semiconductor nanocrystals. Semiconductor nanocrystals possess characteristics and properties that make them particularly well-suited for use in a variety of devices and other end-use applications, including, but not limited to, light emitting devices, displays, photodetectors, nonvolatile random memory devices, solar cells, sensors, photovoltaic devices, etc.

In certain embodiments, the nanomaterial comprises semiconductor nanocrystals wherein at least a portion of the semiconductor nanocrystals include one or more ligands attached to a surface thereof.

In certain embodiments, the method further comprises removal of the liquid vehicle from the ink. In certain embodiments, the liquid vehicle is selected such that, upon removal of the liquid vehicle, the layer including the nanomaterial deposited thereon is planar.

In certain embodiments, the liquid vehicle comprises a liquid in which the material included in the layer onto which the ink is to be deposited is insoluble.

In accordance with another aspect of the invention there is provided a method of fabricating a device. The method comprises depositing an ink in accordance with an aspect or embodiment of the invention over a substrate including an electrode. The substrate may optionally include one or more additional layers and/or features. In another detailed aspect, following deposition onto the substrate, the liquid vehicle is removed from the ink. In another detailed aspect, one or more additional layers and/or features are disposed over the semiconductor nanocrystals.

In accordance with another aspect of the invention, there is provided a method for forming an array of devices comprising: depositing an ink in accordance with an aspect or embodiment of the invention in a predetermined arrangement over a substrate including an electrode. For example, the ink can be deposited in a patterned or unpatterned arrangement.

The substrate may optionally include one or more additional layers and/or features. In another detailed aspect, following deposition onto the substrate, the liquid vehicle is removed from the ink. In another detailed aspect, one or more additional layers and/or features are disposed over the semiconductor nanocrystals. In certain embodiments two or more inks including different light-emissive materials are deposited in a predetermined arrangement. For example, the ink can be deposited in a patterned or unpatterned arrangement.

In accordance with other aspects of the present invention, there are provided devices including an ink composition taught herein. In certain embodiments, the ink and/or or composition is included in a component of the device. In certain embodiments, the ink and/or composition is included on a surface of a component. In certain embodiments, the ink and/or composition can be included as a layer in the device. In certain embodiments, the ink and/or composition is included on a top and/or bottom surface of the device. The ink and/or composition can be included in a predetermined arrangement over a predetermined region of the surface on which it is disposed. Such arrangement can be patterned or unpatterned, in accordance with the particular application. In certain embodiments, more than one predetermined arrangement is included. In certain embodiments, the device comprises a display, a light emitting device, or other lighting unit. In certain embodiments, a device comprises a photovoltaic device. In certain embodiments, a device comprises another electronic or optoelectronic device.

The foregoing, and other aspects described herein all constitute embodiments of the present invention.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 1:
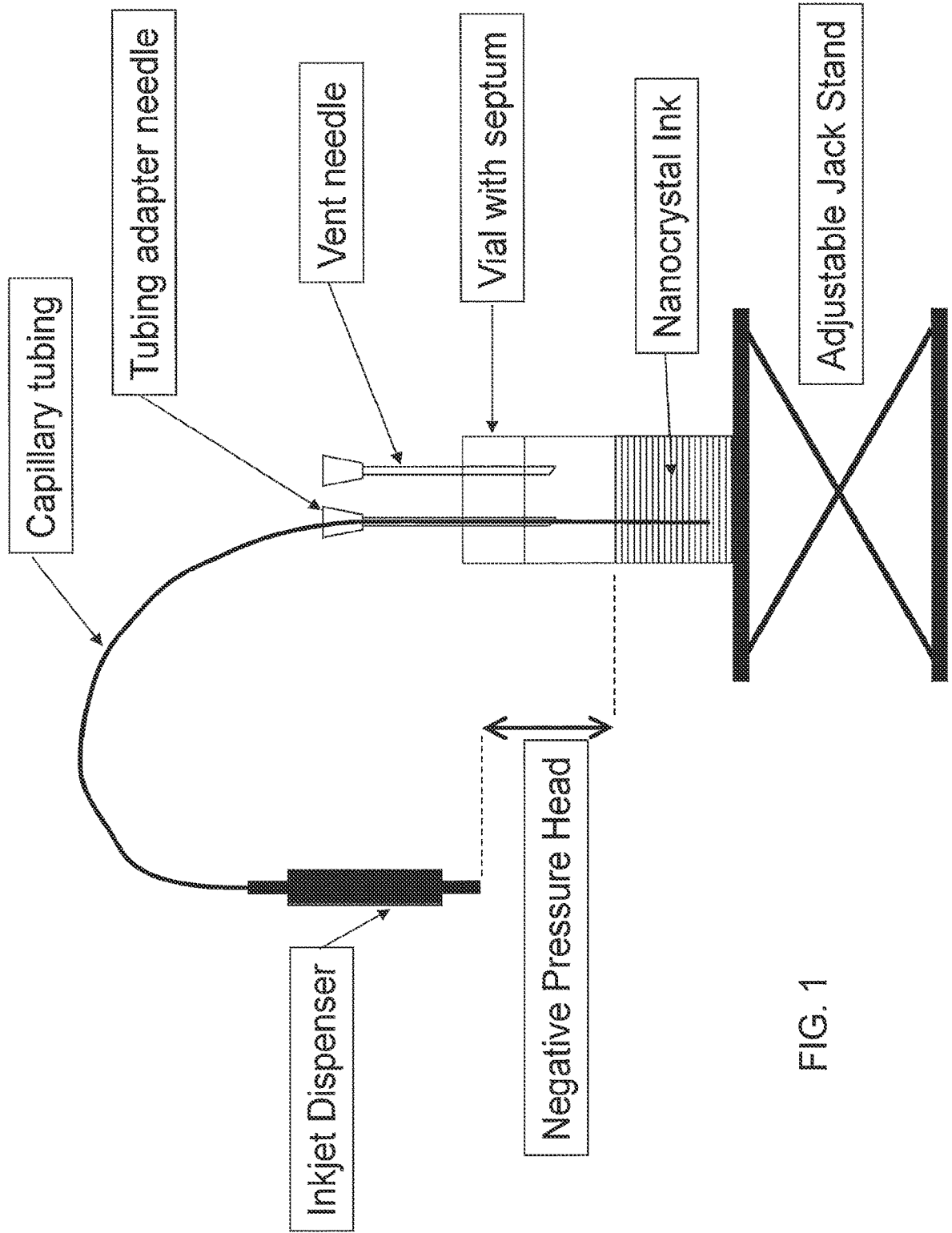
FIG. 1 depicts a schematic of an example of an equipment set-up for use in carrying out an embodiment of a method in accordance with the invention.

The attached figures are simplified representations presented for purposed of illustration only; the actual structures may differ in numerous respects, including, e.g., relative scale, etc.

For a better understanding to the present invention, together with other advantages and capabilities thereof, reference is made to the following disclosure and appended claims in connection with the above-described drawings.

DETAILED DESCRIPTION OF THE INVENTION

In accordance with one aspect of the invention, there is provided an ink composition comprising a nanomaterial and a liquid vehicle, wherein the liquid vehicle comprises a perfluorocompound. In certain most preferred embodiments, the liquid vehicle comprises Fluorinert FC-77, available from 3M.

In certain aspects and embodiments of an ink composition in accordance with the invention, the ink composition comprises a colloidal dispersion.

In certain embodiments, the liquid vehicle comprises a perfluorocompound including one or more functional groups that are capable of being cross-linked. In certain embodiments, the functional units can be cross-linked by UV treatment. In certain embodiments, the functional units can be cross-linked by thermal treatment. In certain embodiments, the functional units can be cross-linked by other cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle.

In accordance with one aspect of the invention, there is provided an ink composition comprising a nanomaterial and a liquid vehicle, wherein the liquid vehicle comprises a composition including one or more functional groups that are capable of being cross-linked. In certain embodiments, the functional units can be cross-linked by UV treatment. In certain embodiments, the functional units can be cross-linked by UV treatment. In certain embodiments, the functional units can be cross-linked by other cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle.

In certain embodiments, the ink can further include scatterers.

In accordance with another aspect of the invention, there is provided an ink composition comprising a nanomaterial, a liquid vehicle, and scatterers.

Examples of scatterers (also referred to herein as scattering particles) include, without limitation, metal or metal oxide particles, air bubbles, and glass beads (solid or hollow). Other scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, and ZnO. Selection of the size and size distribution of the scatterers is readily determinable by those of ordinary skill in the art. The size and size distribution is preferably based upon the refractive index mismatch of the scattering particle and the host material in which it the scatterer is to be dispersed after removal of any liquid medium that may be present, and the preselected wavelength(s) to be scattered according to Rayleigh scattering theory. The surface of the scattering particle may further be treated to improve dispersability and stability in the host material. In one embodiment, the scattering particle comprises $TiO_2$ (R902+ from DuPont) of 0.2 μm particle size, in a concentration between 0.001% and 20% by weight. In certain preferred embodiments, the concentration range of the scatterers is between 0.1% and 10% by weight. In a certain more preferred embodiments, an ink includes a scatterer comprising $TiO_2$ at a concentration in a range from about 1% to about 5% by weight.

In certain aspects and embodiments of the invention described herein, the nanomaterial comprises semiconductor nanocrystals.

In certain aspects and embodiments of the invention described herein, an ink composition in accordance with an embodiment of the invention can further include a variety of components such as those typically used in inkjet liquid vehicles and inks, such as, but not limited to solvents, cosolvents, surfactants, biocides, buffers, viscosity modifiers, sequestering agents, colorants, stabilizing agents, humectants, fillers, extenders, water, and mixtures thereof.

In accordance with another aspect of the invention, there is provided a method for depositing an ink composition comprising a nanomaterial and a liquid vehicle having a surface tension less than about 25 dyne/cm. In certain embodiments, the liquid vehicle has a surface tension no greater than about 15 dyne/cm. Examples of liquid vehicles having a surface tension a vehicle less than about 25 dyne/cm include those in which organic materials typically used in fabricating various electronic devices (e.g., light-emitting devices, photodetectors, and other devices including semiconductor nanocrystals) are insoluble. Examples of such liquid vehicles include fluorinated solvents, such as perfluorodecalin, or the Fluorinert series of solvents sold by 3M. In creating inks from such solvents, the surface tension and viscosity may fall below those normally required for inkjet, e.g., 2.5 dyne/cm. Fluorinert FC-77, for example, has a surface tension of 13 dyne/cm and a viscosity of 1.3 cP.

In certain embodiments, there is provided a method to more consistently inkjet print inks made with these solvents with use of an inkjet system including an inkjet cartridge reservoir which feeds the ink to an ink jet nozzle. The method includes creating a negative pressure (relative to atmospheric) inside an inkjet cartridge reservoir to form a jet that is more stable. This can be accomplished, for example, by placing the inkjet cartridge reservoir below the inkjet nozzle. Preferably, the inkjet cartridge reservoir is held by or positioned relative to the inkjet nozzle(s) such that the height of inkjet cartridge reservoir can be adjusted to obtain a slight negative pressure inside the cartridge reservoir.

In certain embodiments, an ink in accordance with an embodiment of the invention can be deposited from a micro-dispenser, such as an inkjet printhead of an inkjet printing system. Inkjet printing can allow a pattern of ink including a nanomaterial to be conveniently formed on a layer of a device. Inkjet printing can allow precise control over the location and size of inked areas that are printed. Ink spots of about 20 µm in size are readily achievable today by commercially available inkjet printers, and smaller spot sizes are expected to be possible. Different nanomaterials can be patterned simultaneously using an inkjet printing system having multiple print heads. Thus, multiple nanomaterials can be deposited in a single deposition step. This avoids the need to register subsequent depositions to a previously deposited pattern.

An inkjet printing system for use in depositing a nanomaterial can include a printhead having a firing chamber reservoir containing an ink. In one embodiment, an inkjet printing system, for example, can be used to propel the ink onto the material or device layer to be printed using resistive heating elements or piezoelectric elements for propelling the composition through an overlying orifice plate. The ink can be stored in a reservoir and the composition can travel through a set of micro-channels toward the orifice plate. The printhead can have a firing chamber reservoir containing the ink. Examples of inkjet printing systems for use in carrying out methods described herein include, without limitation, Dimatix Materials Printer DMP-2800 Series including Dimatix Materials Cartridge DMC-1000 Series, of Dimatix, Inc., Santa Clara, California Inkjet printing systems from other manufacturers may also be useful in carrying out methods described herein. See also inkjet printing systems described in U.S. Pat. No. 6,997,539 for "Apparatus for Depositing Droplets" of Hoisington et al. (assigned to Dimatix, Inc.), issued on 14 Feb. 2006; U.S. Pat. No. 7,011,936 for "Piezoelectric Ink Jet Module With Seal" of Moynihan et al. (assigned to Dimatix, Inc.), issued on 14 Mar. 2006. The foregoing patents are hereby incorporated herein by reference in their entirety. Examples of other inkjet printing systems include the Omnidot printer available from the Xaar Corporation headquartered in Cambridge, UK. Another example of a nozzle array is a multi-jet nozzle system that includes 126 jets and is sold under the part number XJ126 by Xaar Corporation. Furthermore, an atomization spray process using an ultrasonic spray head to dispense ink droplets may be employed. Additionally, for inks with high viscosities, e.g., 20 centipoise or greater, the Leopard available from the Xaar Corporation may be employed, wherein the ink may be heated to reduce the viscosity to a jettable range.

An example of another inkjet system which is more suitable to research and development needs is the Active Pipette™ piezo system available from Engineering Arts.

An inkjet printing system can include, for example, a data interface, a control subsystem, a positioning subsystem, and a depositing subsystem. It should be appreciated that in other embodiments of the invention, an ink including a nanomaterial comprising semiconductor nanocrystals and a liquid vehicle may be deposited onto a material or device layer by any of a variety of other delivery systems including one or more micro-dispensers, including but not limited to thermal ejection, piezoelectric ejection, aerosol generation, micropipettes, pipettes, ultrasonic heads, etc. that can be configured to dispense a selected volume of solution with the desired application parameters.

Current inkjet technology allows for orifice sizes of from about 15 µm to about 100 µm. Thus, the minimum size of the features that can be deposited is currently limited to about this range, although future developments may allow for smaller orifice sizes and decreased sizes. Additionally, the size of the orifice can affect the practical size of any nanomaterial present in the ink to be inkjetted.

In certain embodiments, inkjetting techniques can include an ink formulation which is tailored to various inkjet pens, including thermal, piezoelectric, sonic impulse, or other known inkjet printing systems.

As discussed above, an ink composition can further include one or more of a variety of components such as those typically used in inkjet liquid vehicles and inks, such as, but not limited to solvents, cosolvents, surfactants, biocides, buffers, viscosity modifiers, sequestering agents, colorants, stabilizing agents, humectants, fillers, extenders, water, and mixtures thereof. Several considerations in selecting the amount of liquid vehicle include those related to nucleation such as heat capacity, heat of vaporization, critical nucleation temperature, diffusivity, and the like. Typically, an ink for use in thermal inkjet printing systems can have a viscosity of from about 0.8 cP to about 20 cP, and in some cases, can be up to 50 cP. Similarly, an ink for use in piezoelectric inkjet printing systems can have a viscosity of from about 2 cP to about 15 cP, and in some cases, can be up to 30 cP. Optionally, a viscosity modifier can be included in the ink. Examples of viscosity modifiers include 2-pyrrolidone, isopropyl alcohol, glycerol, and the like. However, other viscosity modifiers can be used.

In certain embodiments, an ink in accordance with an embodiment of the invention can be deposited from a micro-dispenser, such as an inkjet printhead of an inkjet printing system. Inkjet printing can allow a pattern of ink including a nanomaterial to be conveniently formed on a layer of a device. Inkjet printing can allow precise control over the location and size of inked areas that are printed. Ink spots of about 20 µm in size are readily achievable today by commercially available inkjet printers, and smaller spot sizes are expected to be possible. Different nanomaterials can be patterned simultaneously using an inkjet printing system having multiple print heads. Thus, multiple nanomaterials can be deposited in a single deposition step. This avoids the need to register subsequent depositions to a previously deposited pattern.

The surface tension of an ink used in thermal inkjet printing systems can range from about 25 dyne/cm to about 75 dyne/cm, and in some embodiments, can be from about 30 to about 55 dyne/cm. The surface tension can be adjusted using compounds such as isopropyl alcohol, ethanol, methanol, glycerol, and the like. In certain embodiments, the liquid vehicle can include from about 60 wt % to about ~100 wt % of the ink. Various techniques can be used to modify the viscosity or other jetting properties of the ink. For example, heat can be used to liquefy material, increase solubility of the material, or reduce viscosity such that it becomes inkjettable. Those skilled in the art will recognize that the above discussion is primarily focused on thermal inkjet printing systems; piezoelectric inkjet printing systems involve less restrictive considerations. For example, thermal inkjet printing systems are typically operated at temperatures below about 80° C., while piezoelectric inkjet printing systems can be operated at temperatures of up to about 150° C. Those skilled in the art will recognize which components can be included in the liquid vehicle in order to inkjet an ink from thermal, piezoelectric, or other inkjet printing systems. Those skilled in the art can adjust these and other variables to achieve a variety of resolutions and conductive paths. Printhead waveforms (e.g., piezo and thermal excitation waveforms, anti-clogging waveforms, ejection waveforms, etc.), and the compositions of the materials used to construct the printhead and orifice plate are among such variables. For example, depending on the wetting attributes of the ink and the wettability of the internal surface of the inkjet nozzle or the surface of the printing orifice plate, the ink composition can be treated to enhance drop ejection.

In certain embodiments of the inventions described herein, it may be beneficial to use a vehicle system which would result in ink properties falling outside the normal ranges described above. This would be the case, for example, if one were to use a vehicle in which the material of the device is insoluble. An example of a class of solvents that meet this criterion are fluorinated solvents, such as perfluorodecalin, or the Fluorinert series of solvents sold by 3M. In creating inks from such solvents, the surface tension and viscosity may fall below those normally required for inkjet. Fluorinert FC-77, for example, has a surface tension of 13 dyne/cm and a viscosity of 1.3 cP. A method to more consistently jet inks made with these solvents includes creating a negative pressure (relative to atmospheric) inside the cartridge reservoir to form a jet that is more stable. This can be accomplished at laboratory scale by placing the cartridge reservoir slightly below the inkjet nozzle. The positioning of the cartridge reservoir to achieve a sufficient negative pressure therein to form a jet can be readily determined by one of ordinary skill in the art. Preferably, the inkjet cartridge reservoir is held by or positioned relative to the inkjet nozzle(s) such that the height of inkjet cartridge reservoir can be adjusted to obtain the desired negative pressure inside the cartridge reservoir. In one example, the cartridge reservoir is positioned on a variable-height platform (e.g., a small jack), the height of which can be adjusted to obtain a negative pressure inside the cartridge reservoir, preferably a slight negative pressure. A schematic diagram of an example of a laboratory-scale set-up is shown in FIG. 1. In certain embodiments, semiconductor nanocrystals included in a fluorinated solvent include one or more fluorinated ligands attached to a surface of the nanocrystals. Nanocrystals including fluorinated ligands can be prepared by exchanging at least one or more ligands that become attached to a nanocrystal surface during, e.g., colloidal synthesis, with ligands that include a functional head such as, by way of example, a thiol, carbodithioate, carbodithioic acid, amine, thiourea, amide, phosphine oxide, phosphonic or phosphinic acid, thiophosphonic or thiophosphinic acid, which functional head can be substituted with alkyl and/or aryl units that are perfluorinated or partially fluorinated. Preferably the fluorinated ligand is chemically compatible with the fluorinated liquid vehicle.

Deposition of nanomaterial onto the surface to be printed in the form of ejected drops produces a "dot" of ink comprising a nanomaterial and liquid vehicle thereon. The term "dot" is used to refer to the ink drop once it contacts the surface. In some examples, the ink in the drop will stay in a thin layer on the surface. However, depending on the porosity, wettability, and/or or other attributes of the device layer, and when the drop contacts the layer, the ink can spread outwardly resulting in dot gain. Dot gain is the ratio of the final diameter of a dot on the surface to its initial diameter. If the material or layer onto which the ink is deposited is porous, the dot can penetrate into the material or layer. Dot penetration is the depth that the drop soaks into the surface on which it is deposited. The physical and/or chemical properties of the dots can enhance dissolution rates without disrupting the permeability and specificity of the ink. Controlled dot placement, high surface-to-mass ratio of the dots, and digital mass deposition control of the dots can be used to address performance of the deposited nanomaterial in the device.

For example, a dot has virtually no dot gain or dot penetration, as may be the case, when an ejection solution is applied to a delivery substrate having a nonwettable, surface, or a relatively impermeable surface.

One convenient way of quantifying the nature of the interaction between the ink thrilling the dot and the surface onto which it is deposited, is to measure the angle $\theta$ formed by the liquid-solid and the liquid-air interfaces. This angle, referred to as the contact angle, is a product of the surface tension of the solution as well as the wettability of the surface onto which the ink is deposited. Inks including a liquid vehicle having a high surface tension, and poor interaction with the surface of the device layer to be printed tend to exhibit contact angles greater than 90°. The ink then tends to form discrete droplets on the surface. However, where the liquid vehicle is relatively nonpolar, as is typically the case with an organic liquid, and the surface onto which the ink is deposited device layer is similarly nonpolar, the contact angle is typically less than 90 and the liquid tends to spread out and form a thin film. As the dot spreads out and thins, the contact angle tends to zero.

As described above, an inkjet printing system may be adapted to deposit one or more different nanomaterials comprising different semiconductor nanocrystals, which may be included in corresponding inks. In some embodiments, two or more ejection cartridges can be configured for each to deposit an ink including a different nanomaterial and/or eject ink having different drop volumes. The inkjet system may be configured to interchangeably receive different ejection cartridges, which are individually configured to apply the same of different ink to the surface being printed. Interchangeable ejection cartridges may also be used to replace an empty ejection cartridge with a full ejection cartridge. It is within the scope of this disclosure to utilize other mechanisms for depositing an ink including a nanomaterial and a liquid vehicle onto a material or layer of a device, and ejection cartridge is provided as a nonlimiting example. For example, an inkjet system may include an ejection cartridge that utilizes an ejection-head having ejectors configured to effectuate fluid ejection via a nonthermal mechanism, such as vibrational displacement caused by a piezoelectric ejection element.

In one example of an inkjet system that may be useful in carrying out methods in accordance with the invention, the nozzle spacing can be about 504 µm; the nozzle diameter can be about 27 µm; and the droplet size (for 12 pl) spreads to minimum size 5 µm square.

Based on estimated nozzle life, a nozzle can be expected to coat an area of about 807 ft2. This area corresponds to printing 29,000 two-inch squares or 3,200 six inch square displays. The range of fluid viscosities that can be inkjet printed includes, for example, 8-14 cP. Printing at operating temperatures over 70° C. may be limited by the specific materials and equipment used.

Depending upon the drop volume, contact angle, viscosity, and other properties of the ink, even with a drop volume as small as ~8 pl, the spot diameter can be relatively large due to rapid spreading. Similarly, depending upon the drop volume, contact angle, viscosity, and other properties of the ink, in some instances, to print a linear pattern from an inkjet printing system, repeat printing of drops in an overlapping arrangement may be appropriate.

An ink in accordance with an embodiment of the present invention can be useful for depositing nanomaterial from a micro-dispenser. In certain embodiments, the liquid vehicle comprises a liquid in which the nanomaterial can be dispersed or suspended. In certain preferred embodiments, the nanomaterial is colloidally dispersed. In certain embodiments, the liquid vehicle comprises a liquid in which the nanomaterial does not dissolve or does not appreciably dissolve (e.g., solubility is less than 0.001 mg/ml).

In certain embodiments including a nanomaterial with one or more ligands attached to a surface of at least a portion of the nanoparticles thereof, the liquid vehicle comprises a liquid in which such nanomaterial with attached ligands can be dispersed or suspended. In certain preferred embodiments, the nanomaterial is colloidally dispersed. In certain embodiments, the nanoparticles comprise semiconductor nanocrystals. In certain embodiments, the liquid vehicle is one in which the ligands (when not attached to nanoparticles) are at least partially soluble. In certain embodiments, the liquid vehicle is one in which the ligands (when not attached to nanoparticles) are insoluble.

In certain embodiments, the ink includes a liquid vehicle in which the material or device layer onto which the ink is to be deposited is insoluble (e.g., <0.001/mg/ml of the material dissolves in the liquid vehicle). In other certain embodiments, the ink includes a liquid vehicle in which the material or device layer onto which the ink is to be deposited is at least partially soluble (e.g., >0.001 mg/ml of the material dissolves in the liquid vehicle). In certain embodiments, at least a portion of the nanomaterial can become at least temporarily mixed in the portion of the material or layer that dissolves in the ink.

In certain embodiments, the method further comprises removal of the liquid vehicle from the ink.

In certain embodiments, the liquid vehicle can be removed such that at least a portion of the material or layer and the nanomaterial remain mixed.

In another embodiment, the liquid vehicle can be removed such that the nanomaterial phase separates to form a layer of nanomaterial at or near the surface of the underlying material or layer. Phase separation is described in more detail in U.S. patent application Ser. No. 10/400,907 for "Layered Materials Including Nanoparticles" of Bulovic et al. filed on 28 Mar. 2003, which is hereby incorporated herein by reference in its entirety.

In certain embodiments, the liquid vehicle of the ink is selected such that, upon removal of the liquid vehicle, the material or layer(s) of the device including the nanomaterial deposited thereon is planar. An example of a technique for achieving a planar material or device layer involves utilizing a well structure such as typically used in PLED technology. Other techniques can be readily determined by one of ordinary skill in the relevant art. One technique for measuring planarity is by measuring peak-to-peak height difference. This can be readily measured using an AFM microscope. In certain embodiments, a planar layer has a peak-to-peak height difference less than about 5%.

Examples of a liquid vehicle for inclusion in an ink including a nanomaterial (e.g., a nanomaterial comprising semiconductor nanocrystals) include, without limitation, those listed in the following Table 1, and mixtures of two or more thereof.

Examples of mixtures include, but are not limited to, hexane and octane; benzene and xylene; tetrahydrofurane and anisole; etc.

TABLE 1

| Liquid | Formula | Viscosity @25° C. | Boiling Point @1 atm | Relative Polarity (compared to water) |
|---|---|---|---|---|
| cyclohexane | $C_6H_{12}$ | 0.89 | 80.7 | 0.006 |
| pentane | $C_5H_{12}$ | 0.24 | 36.1 | 0.009 |
| Hexane | $C_6H_{14}$ | 0.30 | 69 | 0.009 |
| heptane | $C_7H_{16}$ | 0.91 | 98 | 0.012 |
| Carbon tetrachloride | $CCl_4$ | 0.91 | 76.7 | 0.052 |
| p-xylene | $C_8H_{10}$ | 0.63 | 138.3 | 0.074 |
| toluene | $C_7H_8$ | 0.56 | 110.6 | 0.099 |
| Benzene | $C_6H_6$ | 0.60 | 80.1 | 0.111 |
| Diethyl ether | $C_4H_{10}O$ | 0.22 | 34.6 | 0.117 |
| Methyl t-butyl alcohol | $C_5H_{12}O$ | | 55.2 | 0.148 |
| Dioxane | $C_4H_8O_2$ | 1.21 | 101.1 | 0.164 |
| tetrahydrofurane (THF) | $C_4H_8O$ | 0.47 | 66 | 0.207 |
| ethyl acetate | $C_4H_8O_2$ | | 77 | 0.228 |
| dimethoxy-ethane (glyme) | $C_4H_{10}O_2$ | | 85 | 0.231 |
| Diglyme | $C_6H_{14}O_3$ | | 162 | 0.244 |
| chloroform | $CHCl_3$ | 0.54 | 61.2 | 0.259 |
| methylene chloride | $CH_2Cl_2$ | 0.43 | 39.8 | 0.309 |
| 2-butanone | $C_4H_8O$ | | 79.6 | 0.327 |
| Acetone | $C_3H_6O$ | 0.31 | 56.2 | 0.355 |
| t-butyl alcohol | $C_4H_{10}O$ | | 82.2 | 0.389 |
| dimethyl-formamide (DMF) | $C_3H_7NO$ | | 153 | 0.404 |
| dimethyl sulfoxide (DMSO) | $C_2H_6OS$ | | 189 | 0.444 |
| Acetonitrile | $C_2H_3N$ | 0.35 | 81.6 | 0.46 |
| 2-propanol | $C_3H_8O$ | 2.40 | 82.4 | 0.546 |
| 1-butanol | $C_4H_{10}O$ | 3.00 | 117.6 | 0.602 |
| 1-propanol | $C_3H_8O$ | 1.95 | 97 | 0.617 |
| acetic acid | $C_2H_4O_2$ | | 118 | 0.648 |
| ethanol | $C_2H_6O$ | 1.20 | 78.5 | 0.654 |
| diethylene glycol | $C_4H_{10}O_3$ | 35.70 | 245 | 0.713 |
| Methanol | $CH_4O$ | 0.59 | 64.6 | 0.762 |
| ethylene glycol | $C_2H_6O_2$ | 16.90 | 197 | 0.79 |
| Glycerin | $C_3H_8O_3$ | 1410.00 | 290 | 0.812 |
| water, heavy (D2O) | $D_2O$ | | 101.3 | 0.991 |
| Water | $H_2O$ | 1.00 | 100 | 1 |
| Nonane | $(CH_3(CH_2)_7CH_3)$ | 0.67 | 39.0 | |
| Decane | $C_{10}H_{22}$ | 0.84 | 174.1 | |
| Dodecane | $C_{12}H_{26}$ | 1.25 | 216.2 | |
| Chlorobenzene | $C_6H_5Cl$ | 0.75 | 132 | |
| Dichlorobenzene | $C_6H_4Cl_2$ | — | 174.0 | |
| Anisole | $C_7H_8O$ | 0.92 | 154.0 | |
| Dimethyl formamide | $HCON(CH_3)_2$ | 0.79 | 149.56 | |
| 1-Methyl-2-pyrrolidinone | | 1.7 | 204.5 | |
| Carbon tetrachloride | $CCl_4$ | 0.91 | 76.8 | |
| 1,1,1-Trichloroethane | $CH_3CCl_3$ | 0.73 | 74.0 | |
| Tetrachloroethylene | $ClCH=CCl_2$ | 0.57 | 87.0 | |

TABLE 1-continued

| Liquid | Formula | Viscosity @25° C. | Boiling Point @1 atm | Relative Polarity (compared to water) |
|---|---|---|---|---|
| Ethylbenzene | $C_8H_{10}$ | 0.67 | 136.0 | |
| Fluorinert FC-77 (a 3M product) | | 1.3 | 97.0 | |

Other liquids or mixtures of liquids can be used as a liquid vehicle. In certain embodiments, volatile liquids or mixtures of volatile liquids can be used as a liquid vehicle.

In certain embodiments, an ink including a nanomaterial and a liquid vehicle has a viscosity in a range of from about 0.1 centipoise (e.g., that of diethyl ether, methanol) to greater than 1500 centipoise (e.g., that of oils, glycerol).

In certain embodiments including a nanomaterial comprising semiconductor nanocrystals, the liquid vehicle comprises an organic non-polar liquid. In certain embodiments, the liquid vehicle has a viscosity less than or equal to about 1 cP and also relatively high volatility.

In certain aspects and embodiments of the inventions described herein, it is not necessary to have the nanomaterial particles (e.g., semiconductor nanocrystals) individually dispersed in the vehicle. The nanomaterial particles (e.g., semiconductor nanocrystals may be aggregated. In certain aspects and embodiments of the inventions described herein, the nanomaterial particles (e.g., semiconductor nanocrystals) may be included within or adsorbed onto polymer particles. In certain embodiments of the inventions described herein, the nanomaterial particles (e.g., semiconductor nanocrystals) may be included within or adsorbed onto a matrix. The matrix can be polymeric or non-polymeric.

In certain aspects and embodiments of the invention described herein, an ink composition in accordance with an embodiment of the invention can further comprises a material capable of transporting charge. In certain embodiments, the material capable of transporting charge has a triplet energy which is at least greater than the bandgap of the semiconductor nanocrystals included in the ink. In certain embodiments, the material capable of transporting charge included in the ink composition is at least partially soluble in the liquid vehicle.

Optionally, other components can be included in the ink. Examples of other components that can be optionally included in the ink include, but are not limited to, e.g., surfactants, solvents, co-solvents, buffers, biocides, viscosity modifiers, complexing agents, chelating agents, stabilizing agents (e.g., to inhibit agglomeration of the nanomaterial), humectants, fillers, extenders etc. Other possible components include other additives of the type that may be included in ink or inkjet ink compositions. Stabilizing agents can include, e.g., chemically attached functional groups or ligands to form a coating around individual nanoparticles.

The amount (e.g., concentration (wt/vol)) of nanomaterial included in an ink can be selected based upon the particular nanomaterial and desired attributes of the deposited nanomaterial (e.g., thickness, optical density, features of the deposited nanomaterial (e.g., patterned or unpatterned, sizes of the features of a pattern, etc.)). The amount can be readily determined by a person of ordinary skill in the art.

For example, in certain embodiments of inks including a nanomaterial comprising semiconductor nanocrystals and a liquid vehicle (including, e.g., but not limited to, a liquid vehicle comprising non-polar organic liquid or liquid mixture), the ink can include at least about 0.1 mg/ml semiconductor nanocrystals. In examples of other embodiments, the ink can include at least 1 mg/ml, at least 5 mg/ml, at least 10 mg/ml, at least 25 mg/ml; at least 50 mg/ml, etc.

In certain embodiments, the nanomaterial and any other optional components are dispersed in the ink when deposited. In certain preferred embodiments, the dispersion is colloidal.

A nanomaterial includes nanoparticles having an average maximum dimension smaller than 100 nm.

In certain preferred embodiments, the nanomaterial comprises semiconductor nanocrystals.

Semiconductor nanocrystals comprise nanometer-scale inorganic semiconductor particles. Semiconductor nanocrystals preferably have an average nanocrystal diameter less than about 150 Angstroms (Å), and most preferably in the range of 12-150 Å.

Semiconductor nanocrystals include, for example, inorganic crystallites between about 1 nm and about 1000 nm in diameter, preferably between about 2 nm and about 50 nm, more preferably about 5 nm to about 20 nm (such as about 6, 7, 8, 9, 10, 11, 12, 13, 14, 15, 16, 17, 18, 19, or 20 nm).

The semiconductor forming the semiconductor nanocrystals can comprise a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys of any of the foregoing, and/or mixtures of any of the foregoing, including ternary and quaternary mixtures and/or alloys. Examples include, but are not limited to, ZnO, ZnS, ZnSe, ZnTe, MgO, MgS, MgSe, MgTe, CdO, CdS, CdSe, CdTe, HgO, HgS, HgSe, HgTe, AlP, AlP, AlAs, AlSb, GaN, GaN, GaAs, GaSb, GaSe, InN, InP, InAs, InSb, TlP, TlAs, TlSb, PbO, PbS, PhSe, PbTe, Si, Ge, other Group IV elements, and/or mixtures or alloys thereof, including ternary and quaternary mixtures or alloys.

Examples of the shape of semiconductor nanocrystals include sphere, rod, disk, other shape or mixtures thereof.

Preferably, the semiconductor nanocrystals include a "core" of one or more first semiconductor materials, which may be surrounded by an overcoating or "shell" of one or more second semiconductor materials. A semiconductor nanocrystal core surrounded by a semiconductor shell is also referred to as a "core/shell" semiconductor nanocrystal.

For example, the semiconductor nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as semiconductor nanocrystal cores include, but are not limited to, CdO, CdS, CdSe, CdTe, ZnO, ZnS, ZnSe, ZnTe, MgO, MgS, MgSe, MgTe, GaAs, GaP, GaSb, GaN, HgS, HgSe, HgTe, InAs, InP, InSh, InN, AlAs, AlP, AlSb, AlS, TlN, TlP, TlAs, TlSb, PbO, PbS, PbSe, Ge, Si, other Group IV elements, and/or mixtures or alloys thereof, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys of any of the foregoing, and/or mixtures of any of the foregoing, including ternary and quaternary mixtures and/or alloys. Examples include, but are not limited to, ZnO, ZnS, ZnSe, ZnTe, CdO, CdS, CdSe, CdTe, MgS, MgSe, MgTe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PhTe, Si, Ge, other Group IV elements, and/or mixtures and/or alloys thereof, including ternary and quaternary mixtures and/or alloys. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness of from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain embodiments, the surrounding shell material can have a band gap less than the band gap of the core material.

In certain embodiments, the shell can be chosen so as to have an atomic spacing close to that of the "core" substrate. In certain embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell.

Additional examples of core/shell semiconductor structures are described in U.S. application Ser. No. 10/638,546, for "Semiconductor Nanocrystal Heterostructures", filed 12 Aug. 2003, and U.S. Published Patent Application No. US 2004-0023010 A1, for "Light Emitting Device Including Semiconductor Nanocrystals" of Bulovic et al. The foregoing applications are hereby incorporated herein by reference in its entirety.

Preparation and manipulation of semiconductor nanocrystals are described, for example, in U.S. Pat. Nos. 6,322,901 and 6,576,291, and U.S. Patent Application No. 60/550,314, each of which is hereby incorporated herein by reference in its entirety. One method of manufacturing a semiconductor nanocrystal is a colloidal growth process. Colloidal growth occurs by injection an M donor and an X donor into a hot coordinating solvent. One example of a preferred method for preparing monodisperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystals. The injection produces a nucleus that can be grown in a controlled manner to form a semiconductor nanocrystal. The reaction mixture can be gently heated to grow and anneal the semiconductor nanocrystal. Both the average size and the size distribution of the semiconductor nanocrystals in a sample are dependent on the growth temperature. The growth temperature necessary to maintain steady growth increases with increasing average crystal size. The semiconductor nanocrystal is a member of a population of semiconductor nanocrystals. As a result of the discrete nucleation and controlled growth, the population of semiconductor nanocrystals that can be obtained has a narrow, monodisperse distribution of diameters. The monodisperse distribution of diameters can also be referred to as a size. Preferably, a monodisperse population of particles includes a population of particles wherein at least 60% of the particles in the population fall within a specified particle size range. A population of monodisperse particles preferably deviate less than 15% rms (root-mean-square) in diameter and more preferably less than 10% rms and most preferably less than 5%.

In certain embodiments, the preparation of semiconductor nanocrystals can be carried out in the presence of an amine. See, for example, U.S. Pat. No. 6,576,291 for "Preparation of Nanocrystallites" of Bawendi et al. issued 10 Jun. 2003, which is hereby incorporated herein by reference in its entirety.

The narrow size distribution of the semiconductor nanocrystals allows the possibility of light emission in narrow spectral widths. Monodisperse semiconductor nanocrystals have been described in detail in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 for "Highly Luminescent Color-Selective Materials". The foregoing are hereby incorporated herein by reference in their entireties.

The process of controlled growth and annealing of the semiconductor nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened. The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. The X donor can be a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide ((TMS)$_2$Se), trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis (trimethylsilyl)telluride ((TMS)$_2$Te), bis(trimethylsilyl)sulfide ((TMS)$_2$S), a trialkyl phosphine sulfide such as (tri-noctylphosphine) sulfide (TOPS), an ammonium salt such as an ammonium halide (e.g., NH$_4$Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the X donor can be moieties within the same molecule.

A coordinating solvent can help control the growth of the semiconductor nanocrystal. The coordinating solvent is a compound having a donor lone pair that, for example, has a lone electron pair available to coordinate to a surface of the growing semiconductor nanocrystal. Solvent coordination can stabilize the growing semiconductor nanocrystal. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the semiconductor nanocrystal production. Examples of suitable coordinating solvents include pyridine, tri-n-octyl phosphine (TOP), tri-n-octyl phosphine oxide (TOPO) and trishydroxylpropylphosphine (tHPP). Technical grade TOPO can be used. Non-coordinating solvents can also be used.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 μm to 800 nm.

The particle size distribution of the semiconductor nanocrystals can be further refined by size selective precipitation with a poor solvent for the semiconductor nanocrystals, such as methanol/butanol as described in U.S. Pat. No. 6,322,901. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size selected semiconductor nanocrystal population preferably has no more than a 15% rms deviation from mean diameter, more preferably 10% rms deviation or less, and most preferably 5% rms deviation or less.

As discussed herein, in certain embodiments, the nanomaterial comprises semiconductor nanocrystals wherein at least a portion of the semiconductor nanocrystals include one or more ligands attached to a surface thereof.

In one embodiment, the ligands are derived from the coordinating solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

The organic ligands can be useful in facilitating large area, non-epitaxial deposition of highly stable inorganic nanocrystals within a device.

More specifically, the coordinating ligand can have the formula:

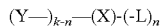

$$(Y-)_{k-n}-(X)-(-L)_n$$

wherein k is 2, 3 or 5, and n is 1, 2, 3, 4 or 5 such that k-n is not less than zero; X is O, S, S=O, SO2, Se, Se=O, N, N=O, P, P=O, As, or As=O; each of Y and L, independently, is aryl, heteroaryl, or a straight or branched C2-12 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N($R_a$)—C(O)—O—, —O—C(O)—N($R_a$)—, —N($R_a$)—C(O)—N($R_b$)—, —P($R_a$)—, or —P(O)($R_a$)—. Each of $R_a$ and $R_b$, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

A suitable coordinating ligand can be purchased commercially or prepared by ordinary synthetic organic techniques, for example, as described in J. March, Advanced Organic Chemistry, which is hereby incorporated by reference in its entirety.

Other ligands are described in U.S. patent application Ser. No. 10/641,292 for "Stabilized Semiconductor Nanocrystals", filed 15 Aug. 2003, which is hereby incorporated herein by reference in its entirety.

When the electron and hole localize on a semiconductor nanocrystal, emission can occur at an emission wavelength. The emission has a frequency that corresponds to the band gap of the quantum confined semiconductor material. The band gap is a function of the size of the semiconductor nanocrystal. Semiconductor nanocrystals having small diameters can have properties intermediate between molecular and bulk forms of matter. For example, semiconductor nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of semiconductor nanocrystals shift to the blue, or to higher energies, as the size of the crystallites decreases.

The emission from a semiconductor nanocrystal can be a narrow Gaussian emission band that can be tuned through the complete wavelength range of the ultraviolet, visible, or infra-red regions of the spectrum by varying the size of the semiconductor nanocrystal, the composition of the semiconductor nanocrystal, or both. For example, CdSe can be tuned in the visible region and InAs can be tuned in the infra-red region. The narrow size distribution of a population of semiconductor nanocrystals can result in emission of light in a narrow spectral range. The population can be monodisperse preferably exhibits less than a 15% rms (root-mean-square) deviation in diameter of the semiconductor nanocrystals, more preferably less than 10%, most preferably less than 5%. Spectral emissions in a narrow range of no greater than about 75 nm, preferably 60 nm, more preferably 40 nm, and most preferably 30 nm full width at half max (FWHM) for semiconductor nanocrystals that emit in the visible can be observed, IR-emitting semiconductor nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of semiconductor nanocrystal diameters decreases. Semiconductor nanocrystals can have high emission quantum efficiencies such as greater than 10%, 20%, 30%, 40%, 50%, 60%, 70%, or 80%.

The narrow FWHM of semiconductor nanocrystals can result in saturated color emission. This can lead to efficient lighting devices even in the red and blue parts of the visible spectrum, since in semiconductor nanocrystal emitting devices no photons are lost to infra-red and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A device including semiconductor nanocrystals of different compositions, sizes, and/or structures can emit light in more than one narrow range of wavelengths. The color of emitted light perceived by a viewer can be controlled by selecting appropriate combinations of semiconductor nanocrystal sizes and materials in the device as well as relative subpixel currents. The degeneracy of the band edge energy levels of semiconductor nanocrystals facilitates capture and radiative recombination of all possible excitons, whether generated by direct charge injection or energy transfer. The maximum theoretical semiconductor nanocrystal lighting device efficiencies are therefore comparable to the unity efficiency of phosphorescent organic light-emitting devices. The excited state lifetime ($\tau$) of the semiconductor nanocrystal is much shorter ($\tau\sim10$ ns) than a typical phosphor ($\tau>0.1$ µs), enabling semiconductor nanocrystal lighting devices to operate efficiently even at high current density and high brightness.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

Ink compositions in accordance with the invention can be deposited onto a surface.

Examples of typical surfaces include a material or device layer or other substrate.

In certain embodiments, the substrate can be, for example, a web, a film, a tape, a flexible sheet, etc. Such forms of substrates can comprise, for example, plastic, foil, paper, etc. In certain embodiments, a substrate can comprise a sheet of material, a roll of material, etc. The dimensions of a substrate can vary as a function of the intended use thereof. In certain embodiments, a non-rigid substrate is desirable. In certain embodiments, a flexible substrate is preferred.

In certain embodiments, the substrate can be a top or bottom surface of a light emitting device or other lighting unit.

In certain embodiments, a substrate can further include a layer of a device disposed over a substrate. In these embodiments, the layer of a device comprises a material and the ink is deposited onto the layer.

In certain embodiments, the ink is deposited onto a layer of a device disposed over a substrate. In certain embodiments, the substrate further includes a layer of a device disposed over the substrate. In these embodiments, the layer of a device comprises a material and the ink is deposited onto the layer.

In certain embodiments, the ink is deposited in a predetermined arrangement. For example, the ink can be deposited in a patterned or unpatterned arrangement.

It is believed that the present invention can offer significant advantages, especially, for example, for devices including large substrates, e.g., larger than about 0.5 meters in at least one dimension and/or when predetermined arrangements of nanomaterial are desired.

In certain embodiments and aspects of the inventions contemplated by this disclosure, the nanomaterial comprises inorganic nanoparticles capable of emitting light.

In certain embodiments and aspects of the inventions contemplated by this disclosure, the nanomaterial comprises semiconductor nanocrystals. Semiconductor nanocrystals possess characteristics and properties that make them particularly well-suited for use in a variety of devices and other end-use applications, including, but not limited to, light emitting devices, displays, photodetectors, nonvolatile random memory devices, solar cells, sensors, photovoltaic devices, etc.

In certain embodiments and aspects of the inventions contemplated by this disclosure, the nanomaterial comprises semiconductor nanocrystals wherein at least a portion of the semiconductor nanocrystals include one or more ligands attached to a surface thereof.

In certain embodiments, a method further comprises removal of the liquid vehicle from the ink. In certain embodiments, the liquid vehicle is selected such that, upon removal of the liquid vehicle, the layer including the nanomaterial deposited thereon is planar.

In certain embodiments, the liquid vehicle comprises a liquid in which the material included in the layer onto which the ink is deposited is insoluble.

In certain embodiments, the layer of the device onto which the ink is deposited comprises a small molecule material. A "small molecule" material refers to any organic material that is not a polymer. A small molecule material can further include a metal. A small molecule can include an organometallic compound. A small molecule material can include a metal complex. A small molecule material can include repeating units in some circumstances. For example, using a long chain alkyl group as a substituent does not remove a molecule from the "small molecule" class. Other examples of small molecule materials can include organic oligomer molecules (e.g., organic molecules of intermediate relative molecular mass, the structure of which essentially comprises a small plurality of units derived, actually or conceptually, from molecules of lower relative molecular mass, see "oligomer molecule" from IUPAC Compendium of Chemical Terminology 2" Edition (1997) including related Notes, which are hereby incorporated herein by reference.)

In certain embodiments, a small molecule material may serve as the core moiety of a dendrimer, which includes a series of chemical shells built on the core moiety. The core moiety of a dendrimer may be a fluorescent or phosphorescent small molecule emitter.

Dendrimer substituents can also be used to enhance the ability of small molecules to undergo solution processing.

In certain embodiments, the layer of the device onto which the ink is deposited comprises a polymer.

In certain embodiments, the layer of the device onto which the ink is deposited can comprise an organic nanocrystal. Examples of organic nanocrystals include, without limitation, J-aggregates, H-aggregates, and organic nanocrystals including aggregates with other dipole arrangements. Examples of organic nanocrystals are described in S. Kirstein et al., "Herringbone Structures In Two-Dimensional Single Crystals of Cyanine Dyes. I. Detailed Structure Analysis Using Electron Diffraction", J. Chem. Phys. 103(2) July 1995, pages 816 et seq.; S. Kirstein et al., "Herringbone Structures In Two-Dimensional Single Crystals of Cyanine Dyes. II. Optical Properties", J. Chem. Phys. 103(2) July 1995, pages 826 et seq.; A. Mishra et al, "Cyanines During the 1990s: A Review", Chem. Rev. 2000, 100, 1973-2011; and C. Peyratout et al., "Aggregation of Thiacyanine Derivatives On Polyelectrolytes, Phys. Chem. Chem. Phys., 2002, 4, 3032-3039, the disclosures of which are hereby incorporated herein by reference in their entireties.

In certain embodiments, the layer of the device onto which the ink is deposited comprises carbon nanotubes.

In certain embodiments, the layer of the device onto which the ink is deposited comprises a carbon nanotube/polymer blend or hybrid.

In certain embodiments, the layer of the device onto which the ink is deposited comprises an inorganic material.

In certain embodiments, the layer of the device onto which the ink is deposited can be disposed over a substrate which may also include an electrode.

In certain embodiments, the layer of the device onto which the ink is deposited comprises an electrode.

In certain embodiments, one or more other layers can be disposed over the substrate before the ink.

In certain embodiments, the method can further include depositing a second electrode layer over the nanomaterial. The deposition of one or more additional layers (including, for example, hole Hocking layer, electron transport layer, electron injection layer, etc.) can also optionally be included before or after deposition of the second electrode layer. Passivation, packaging, etc. can also optionally be included.

In certain embodiments, the ink is deposited onto a material capable of transporting charge.

In certain embodiments, the nanomaterial is deposited as one or more separate layers. In certain embodiments of fabricating a device, nanomaterial can be disposed between any two layers of the device. In certain embodiments, nanomaterial comprising semiconductor nanocrystals can be deposited as one or more separate emissive layers disposed between a hole transport layer and an electron transport layer. In certain embodiments, for example, nanomaterial can be disposed between two hole transport layers and/or between two electron transport layers. Each charge transport layer included in a device may further comprise one or more layers. As discussed elsewhere herein, other layers may also be included between the electron transport layers and the hole transport layers. When included in the device as a separate layer, for example, nanomaterial comprising semiconductor nanocrystais can be disposed as a continuous or substantially continuous thin film or layer. When disposed as a separate layer, the layer can be patterned or unpatterned. Preferably, the nonmaterial comprising semiconductor nanocrystals included in the device comprises a substantially monodisperse population of semiconductor nanocrystals.

In certain embodiments, nanomaterial comprising semiconductor nanocrystals is deposited at a thickness of multiple monolayers or less. For example, the thickness can be greater than three monolayers, three or less monolayers, two or less monolayers, a single monolayer, a partial monolayer, etc. The thickness of each deposited layer of nanomaterial comprising semiconductor nanocrystals may vary. Preferably, the variation of the thickness at any point of the deposited semiconductor nanocrystals is less than three monolayers, more preferably less than two monolayers, and most preferably less than one monolayer. When deposited as a single monolayer, preferably at least about 60% of the semiconductor nanocrystals are at single monolayer thickness, more preferably, at least about 80% of the semiconductor nanocrystals are at single monolayer thickness, and most preferably, at least about 90% of the semiconductor nanocrystals are at single monolayer thickness. In a light-emitting device, a monolayer can provide the beneficial light emission properties of semiconductor nanocrystals while minimizing the impact on electrical performance.

Semiconductor nanocrystals show strong quantum confinement effects that can be harnessed in designing bottom-up chemical approaches to create complex heterostructures with electronic and optical properties that are tunable with the size and composition of the semiconductor nanocrystals.

As discussed herein, in certain embodiments, nanomaterial comprising semiconductor nanocrystals can be deposited in a patterned arrangement. Patterned semiconductor nanocrystals can be used to form an array of pixels comprising, e.g., red, green, and blue, or alternatively, red, orange, yellow, green, blue-green, blue, violet, or other visible, infrared, or ultraviolet emitting, or other combinations of distinguishable wavelength emitting pixels, that are energized to produce light of a predetermined wavelength.

Generally, a device or array of devices capable of emitting a variety of colors includes a pattern of emissive materials capable of emitting different colors. Depositing nanomaterials from inks in accordance with an embodiment of the present invention using inkjet printheads and/or other micro-dispensers allows such pattern to be deposited without the use of shadow masks and other patterning techniques associated with vapor phase deposition. Such deposition process also eliminates the need for a transfer step as in contact printing.

When deposited in a patterned arrangement, nanomaterial can be deposited in a pattern comprising features having at least one dimension at a micron-scale (e.g., less than 1 mm, less than 500 µm, less than 200 µm, less than 100 µm or less, less than 50 µm or less, less than 20 µm or less). Nanomaterial can also be deposited in a patterned arrangement comprising features at greater than micron-scale.

A pattern comprising deposited nanomaterial having features on the micron scale may also be referred to herein as a micropattern. A micropattern can have features on the micron scale, such as less than 1 mm, less than 500 µm, less than 200 µm, less than 100 µm, less than 50 µm, or 20 µm or less in size. A 20 µm feature size is sufficiently small for most light emitting devices and devices for other applications.

The surface on which the nanomaterial can be deposited can have dimensions of 1 cm or greater, 10 cm or greater, 100 cm or greater, or 1,000 cm or greater.

Compositions and methods in accordance with the invention are scalable and can be useful in depositing a pattern comprising one or more nanomaterials over a wide range of surface areas.

For example, the method is useful for depositing nanomaterial over very small areas (for example, 100 μm catheters) to very large areas, (for example, 12" square areas). In further example, the method is also useful for depositing nanomaterial over surfaces with dimensions such as GEN2 (360 mm×465 mm), GEN3 (550 mm×650 mm), GEN3.5 (600 mm×720 mm), GEN4 (730 mm×920 mm), GEN5 (1110 mm×1250 mm), GEN6 (1500 mm×1800 mm), GEN7 (1900 mm×2100 mm), and subsequent generations of glass that can be used, e.g., in displays. Optionally, areas onto which nanomaterial is applied can then be stitched (or tiled) together, to expand the printable area from 12" squares, to 'n×12" squares' as is frequently done in the semiconductor lithography field.

Inks in accordance with the invention can be included in making various devices. Additional information concerning examples of various devices and various deposition and other techniques that may be useful with the present invention include, for example, those disclosed in International Patent Application No. PCT/US2007/014711, entitled "Methods For Depositing Nanomaterial, Methods For Fabricating A Device, And Methods For Fabricating An Array Of Devices", of Seth A. Coe-Sullivan, filed 25 Jun. 2007, International Patent Application No. PCT/US2007/014705, entitled "Methods For Depositing Nanomaterial, Methods For Fabricating A Device, Methods For Fabricating An Array Of Devices And Compositions", of Seth A. Coe-Sullivan, et al., filed 25 Jun. 2007, International Patent Application No. PCT/US2007/014706, entitled "Methods And Articles Including Nanomaterial", of Seth A. Coe-Sullivan, et al., filed 25 Jun. 2007, International Patent Application No. PCT/US2007/08873, entitled "Composition Including Material, Methods Of Depositing Material, Articles Including Same And Systems For Depositing Material", of Seth A. Coe-Sullivan, et al., filed 9 Apr. 2007, International Patent Application No. PCT/US2007/09255, entitled "Methods Of Depositing Material, Methods Of Making A Device, And Systems And Articles For Use In Depositing Material", of Maria J, Anc, et al., filed 13 Apr. 2007, International Patent Application No. PCT/US2007/08705, entitled "Methods And Articles Including Nanomaterial", of Seth Coe-Sullivan, et al, filed 9 Apr. 2007, International Patent Application No. PCT/US2007/08721, entitled "Methods Of Depositing Nanomaterial & Methods Of Making A Device" of Marshall Cox, et al., filed 9 Apr. 2007, U.S. patent application Ser. No. 11/253,612, entitled "Method And System For Transferring A Patterned Material" of Seth Coe-Sullivan, et al., filed 20 Oct. 2005, and U.S. patent application Ser. No. 11/253,595, entitled "Light Emitting Device Including Semiconductor Nanocrystals", of Seth Coe-Sullivan, et al., filed 20 Oct. 2005, each of the foregoing patent applications being hereby incorporated herein by reference.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix.

Figure 2:
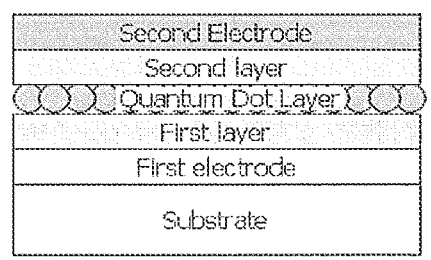
FIG. 2 depicts a schematic of an example of a structure of a light-emitting device.

An example of an embodiment of a light-emitting device is shown in FIG. 2. The depicted example includes a first electrode disposed over a substrate, a first layer in electrical connection with the first electrode, a second layer in electrical connection with the first layer, and a second electrode in electrical connection with the second layer. The first layer can comprise a material capable of transporting holes (HTL) and the second layer can comprise a material capable of transporting electrons (ETL). At least one layer can be non-polymeric. An emissive material is included between the two electrodes. The emissive material can include a plurality of semiconductor nanocrystals that can be selected based upon their light-emissive characteristics (e.g., the wavelength of the photon emitted by the nanocrystal when voltage is applied across the device). The emissive material can be included as one (as shown in FIG. 2) or more layers between the first layer and the second layer. In the figures the layer including the emissive material is designated as a "quantum dot layer". In the embodiment depicted in FIG. 2 the first electrode of the structure is in contact with the substrate. Each electrode can be connected to a power supply to provide a voltage across the structure. Electroluminescence can be produced by the semiconductor nanocrystals included in the device when a voltage of proper polarity is applied across the heterostructure.

The device structure depicted in FIG. 2 maybe fabricated as follows. A substrate having a first electrode (e.g., an anode) disposed thereon may be obtained or fabricated using any suitable technique. The first electrode may be patterned. A first layer (e.g., a hole transport layer) may be deposited using any suitable technique. An emissive layer is deposited from an ink in accordance with an embodiment of the present invention. In certain embodiments, ink is dispensed from a micro-dispenser, e.g., inkjet printhead. Inkjet printing is preferred, because it readily allows for the patterning of separate regions. In certain embodiments, the liquid vehicle of the ink is selected such that, upon removal of the liquid vehicle, the layer(s) of the device are planar (for example, utilizing a well structure such as typically used in polymer light emitting device (PLED) technology). A second layer (e.g., an electron transport layer) may be deposited using any suitable technique. A second electrode (e.g., a cathode) may be deposited using any suitable technique.

In the example shown in FIG. 2, light is emitted from the bottom of the structure (through, e.g., ITO coated glass). If an adequately light transmissive top electrode is used, the structure could emit light from the top of the structure.

Alternatively, the structure of FIG. 2 can be inverted, in which case light can be emitted from the top.

The simple layered structure illustrated in FIG. 2 is provided by way of non-limiting example, and it is understood that embodiments of the invention may be used in connection with a wide variety of other structures. The specific materials and structures described herein are exemplary in nature, and other materials and structures may be used. Functional devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be limiting.

The color of the light output of a light-emitting device can be precisely controlled by the selection of the composition, structure, and size of the various semiconductor nanocrystals included in a device as the emissive material. In certain embodiments, two or more different semiconductor nanocrystals (having different compositions, structures, and/or sizes) can be included.

Figure 3:
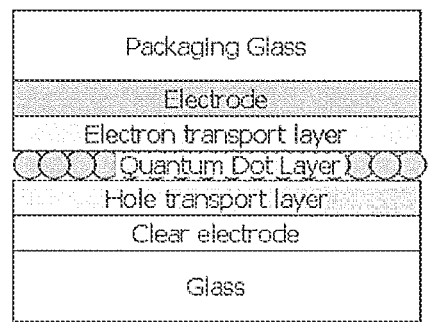
FIG. 3 depicts a schematic of an example of a structure of a light-emitting device.

FIG. 3 illustrates an example of another embodiment of a light-emitting device showing a glass substrate on which the device can be built and a protective glass layer that can be used to encapsulate the device.

Optionally a desiccant or other moisture absorptive material can be included in the device before it is sealed, e.g., with an epoxy, such as a UV curable expoxy. Other desiccants or moisture absorptive materials can be used.

The first electrode can be, for example, an anode comprising a high work function great than 4.0 eV) hole-injecting conductor, such as an indium tin oxide (ITO) layer. Other anode materials include other high work function hole-injection conductors including, but not limited to, for example, tungsten, nickel, cobalt, platinum, palladium and their alloys, gallium indium tin oxide, zinc indium tin oxide, titanium nitride, polyaniline, or other high work function hole-injection conducting polymers. In certain embodiments, the first electrode is light transmissive or transparent. In addition to ITO, examples of other light-transmissive electrode materials include conducting polymers, and other metal oxides, low or high work function metals, conducting epoxy resins, or carbon nanotubes/polymer blends or hybrids that are at least partially light transmissive. An example of a conducting polymer that can be used as an electrode material is poly(ethlyendioxythiophene), sold by Bayer AG under the trade mark PEDOT. Other molecularly altered poly(thiophenes) are also conducting and could be used, as well as emaraldine salt form of polyaniline.

The second electrode can be, for example, a cathode comprising a low work function (e.g., less than 4.0 eV), electron-injecting, metal, such as Al, Ba, Yb, Ca, a lithium-aluminum alloy (Li:Al), a magnesium-silver alloy (Mg:Ag), or lithium fluoride-aluminum (LiF:Al). The second electrode, such as Mg:Ag, can optionally be covered with an opaque protective metal layer, for example, a layer of Ag for protecting the cathode layer from atmospheric oxidation, or a relatively thin layer of substantially transparent ITO. The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device.

In a device such as that shown in FIG. 2, for example, the first electrode can have a thickness of about 500 Angstroms to 4000 Angstroms. The first layer can have a thickness of about 30 Angstroms to about 1000 Angstroms. The second layer can have a thickness of about 30 Angstroms to about 1000 Angstroms. The second electrode can have a thickness of about 5 Angstroms to greater than about 10,000 Angstroms.

Non-polymeric electrode materials can be deposited by, for example, sputtering or evaporating. Polymeric electrode materials can be deposited by, for example, spin-casting.

As discussed above, the electrodes can be patterned. Electrode material, including light-transmittable electrode material, can be patterned by, for example, a chemical etching method such as a photolithography or a physical etching method using laser, etc. Also, the electrode may be patterned by vacuum vapor deposition, sputtering, etc. while masking.

Hole transport and electron transport layers can be collectively referred to as charge transport layers. Either or both of these layers can comprise organic or inorganic materials. Examples of inorganic material include, for example, inorganic semiconductors. The inorganic material can be amorphous or polycrystalline. An organic charge transport material can be polymeric or non-polymeric. In certain embodiments, the charge transport materials are gradient sublimation purified.

An example of a typical organic material that can be included in an electron transport layer includes a molecular matrix. The molecular matrix can be non-polymeric. The molecular matrix can include a small molecule, for example, a metal complex. The metal complex of 8-hydoxyquinoline can be an aluminum, gallium, indium, zinc or magnesium complex, for example, aluminum tris(8-hydroxyquinoline) ($Alq_3$). Other classes of materials in the electron transport layer can include metal thioxinoid compounds, oxadiazole metal chelates, triazoles, sexithiophenes derivatives, pyrazine, and styrylanthracene derivatives. Balq2 is an example of another material that can be included in an electron transport layer. An electron transport layer comprising an organic material may be intrinsic (undoped) or doped. Doping may be used to enhance conductivity. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

An example of a typical organic material that can be included in a hole transport layer includes an organic chromophore. The organic chromophore can include a phenyl amine, such as, for example, N,N'-diphenyl-N,N'-bis(3-methylphenyl)-(1,1'-biphenyl)-4,4'-diamine (TPD). Other hole transport layer can include N,N'-bis(3-methylphenyl)-N,N'-bis(phenyl)-spire (spiro-TPD), 4,4'-N,N'-dicarbazoyl-biphenyl (CBP), 4,4-bis[N-(1-naphthyl)-N-phenylamino]biphenyl (NPD), etc., a polyaniline, a polypyrrole, a poly (phenylene vinylene), copper phthalocyanine, an aromatic tertiary amine or polynuclear aromatic tertiary amine, a 4,4'-bis(p-carbazolyl)-1,1'-biphenyl compound, or an N,N,N',N'-tetraarylbenzidine. A hole transport layer comprising an organic material may be intrinsic (undoped) or doped. Doping may be used to enhance conductivity. Examples of doped hole transport layers are described in U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

Charge transport layers comprising organic materials and other information related to fabrication of organic charge transport layers, light-emitting devices, and related technology are discussed in more detail in U.S. patent application Ser. No. 11/253,612 for "Method And System For Transferring A Patterned Material", filed 21 Oct. 2005, and Ser. No. 11/253,595 for "Light Emitting Device including Semiconductor Nanocrystals", filed 21 Oct. 2005 and International Patent Application No. PCT/US2007/13152 for "Light-Emitting Devices And Displays With Improved Performance", filed 4 Jun. 2007. The foregoing patent applications are hereby incorporated herein by reference in its entirety.

Organic charge transport layers may be disposed by known methods such as a vacuum vapor deposition method, a sputtering method, a dip-coating method, a spin-coating method, a casting method, a bar-coating method, a roll-coating method, and other film deposition methods. In certain embodiments, organic layers are deposited under ultra-high vacuum (e.g., $\leq 10^{-8}$ torr), high vacuum (e.g., from about $10^{-8}$ torr to about $10^{-5}$ torr), or low vacuum conditions (e.g., from about $10^{-5}$ torr to about $10^{-3}$ torr). Preferably, the organic layers are deposited at high vacuum conditions of from about $1\times 10^{-7}$ to about $1\times 10^{-6}$ torr or from about $1\times 10^{-7}$ to about $5\times 10^{-6}$ torr. Alternatively, organic layers may be formed by multi-layer coating while appropriately selecting solvent for each layer.

Charge transport layers including inorganic materials and other information related to fabrication of inorganic charge transport layers are discussed further below and in more detail in U.S. Patent Application No. 60/653,094 for "Light Emitting Device Including Semiconductor Nanocrystals, filed 16 Feb. 2005 and U.S. patent application Ser. No. 11/354,185, filed 15 Feb. 2006, the disclosures of each of which are hereby incorporated herein by reference in their entireties.

Charge transport layers comprising an inorganic semiconductor can be deposited on a substrate at a low temperature, for example, by a known method, such as a vacuum vapor deposition method, an ion-plating method, sputtering, inkjet printing, etc.

The substrate can be opaque, light transmissive, or transparent. The substrate can be rigid or flexible. The substrate can be plastic, metal or glass.

In some applications, the substrate can include a backplane. The backplane includes active or passive electronics for controlling or switching power to individual pixels. Including a backplane can be useful for applications such as displays, sensors, or imagers. In particular, the backplane can be configured as an active matrix, passive matrix, fixed format, direct drive, or hybrid. The display can be configured for still images, moving images, or lighting. A display including an array of light emitting devices can provide white light, monochrome light, or color-tunable light.

In addition to the charge transport layers, a device may optionally further include one or more charge-injection layers, e.g., a hole-injection layer (HIL) (either as a separate layer or as part of the hole transport layer) and/or an electron-injection layer (EIL) (either as a separate layer as part of the electron transport layer). Charge injection layers comprising organic materials can be intrinsic (un-doped) or doped. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

One or more charge blocking layers may still further optionally be included. For example, an electron blocking layer (EBL), a hole blocking layer (HBL), or an exciton blocking layer (eBL), can be introduced in the structure. A blocking layer can include, for example, 3-(4-biphenylyl)-4-phenyl-5-tert butylphenyl-1,2,4-triazole (TAZ), 2,2',2"-(1,3,5-Benzinetriyl)-tris(1-phenyl-1-H-benzimidazole) (TBPi), 3,4,5-triphenyl-1,2,4-triazole, 3,5-bis(4-tert-butylphenyl)-4-phenyl-1,2,4-triazole, bathocuproine (BCP), 4,4',4"-tris{N-(3-methylphenyl)-N-phenylamino} triphenylamine (m-MT-DATA), polyethylene dioxythiophene (PEDOT), 1,3-bis(5-(4-diphenylamino)phenyl-1,3,4-oxadiazol-2-yl)benzene, 2-(4-biphenylyl)-5-(4-tertbutylphenyl)-1,3,4-oxadiazole, 1,3-bis[5-(4-(1,1-dimethylethyl)phenyl)-1,3,4-oxadiazol-5,2-yl]benzene, 1,4-bis(5-(4-diphenylamino)phenyl-1,3,4-oxadiazol-2-yl)benzene, or 1,3,5-tris[5-(4-(1,1-dimethylethyl)phenyl)-1,3,4-oxadiazol-2-yl]benzene. Charge blocking layers comprising organic materials can be intrinsic (un-doped) or doped. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

The charge injection layers (if any), and charge blocking layers (if any) can be deposited on a surface of one of the electrodes by spin coating, dip coating, vapor deposition, or other thin film deposition methods. See, for example, M. C. Schlamp, et al., J. Appl. Phys., 82, 5837-5842, (1997); V. Santhanam, et al., Langmuir, 19, 7881-7887, (2003); and X. Lin, et al., J. Phys. Chem. B, 105, 3353-3357, (2001), each of which is incorporated by reference in its entirety.

Other multilayer structures may optionally be used to improve the performance (see, for example, U.S. patent application Ser. Nos. 10/400,907 and 10/400,908, filed Mar. 28, 2003, each of which is incorporated by reference in its entirety) of the light-emitting devices and displays of the invention. The performance of light-emitting devices can be improved by increasing their efficiency, narrowing or broadening their emission spectra, or polarizing their emission. See, for example, Bulovic et al., Semiconductors and Semimetais 64, 255 (2000), Adachi et al., Appl. Phys, Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety.

Preferably, a device including a nanomaterial comprising semiconductor nanocrystals is processed in a controlled (oxygen-free and moisture-free) environment, preventing the quenching of luminescent efficiency during the fabrication process.

Besides being useful to deposit nanomaterials in fabricating devices and displays, other layers of a device and/or array (e.g., electrodes, charge transport layers, charge blocking layers, charge injection layers, etc.) can also be deposited from micro-dispensers, e.g., inkjet printheads. Fabricating multiple device layers using micro-dispensers, e.g., inkjet printheads, can simplify the manufacturing process and provide other manufacturing efficiencies.

Because of the diversity of semiconductor nanocrystal materials that can be prepared, and the wavelength tuning via semiconductor nanocrystal composition, structure, and size, devices that can emit light of a predetermined color are possible with use of semiconductor nanocrystals as the emissive material. Semiconductor nanocrystal light-emitted devices can be tuned to emit anywhere in the spectrum. Light-emitting devices can be prepared that emit visible or invisible (e.g., IR) light. The size and material of a semiconductor nanocrystal can be selected such that the semiconductor nanocrystal emits light having a predetermined wavelength. Light emission can be of a predetermined wavelength in any region of the spectrum, e.g., visible, infrared, etc. For example, the wavelength can be between 300 and 2,500 nm or greater, for instance between 300 and 400 nm, between 400 and 700 nm, between 700 and 1100 nm, between 1100 and 2500 nm, or greater than 2500 nm.

In certain embodiments, individual light-emitting devices can be formed. In other embodiments, a plurality of individual light-emitting devices can be formed at multiple locations on a single substrate to form a display.

A display can include two or more devices that emit at the same or different wavelengths. By patterning the substrate with arrays of nanomaterials comprising different color-emitting semiconductor nanocrystals, a display including pixels of different colors can be formed. Patterned semiconductor nanocrystals can be used to form an array of pixels comprising, e.g., red, green, and blue or alternatively, red, yellow, green, blue-green, and/or blue emitting, or other combinations of distinguishable color emitting pixels, that are energized to produce light of a predetermined wavelength. In certain embodiments, one or more pixel can emit in the ultraviolet or infrared emission portion of the spectrum.

An individual light-emitting device or one or more light-emitting devices of a display can optionally include a mixture of different color-emitting semiconductor nanocrystals formulated to produce a white light. White light can alternatively be produced from a device including red, green, blue, and, optionally, additional pixels.

Examples of other displays are included in U.S. Patent Application No. 60/771,643 for "Displays Including Semiconductor Nanocrystals And Methods Of Making Same", of Seth Coe-Sullivan et al., filed 9 Feb. 2006, the disclosure of which is hereby incorporated herein by reference in its entirety.

As discussed above, the methods described herein may have applications in fabricating other devices in addition to light-emitting devices, including, but not limited to, solar cells, photovoltaic devices, photodetectors, non-volatile memory devices, etc.

For example, a nanomaterial, e.g., a nanomaterial comprising semiconductor nanocrystals, can be deposited by a method in accordance with the invention in fabrication of a photodetector device or array of photodetector devices. A photodetector device includes one or more nanomaterials comprising a plurality of semiconductor nanocrystals which are selected based upon absorption properties. When included in a photodetector, semiconductor nanocrystals are engineered to produce a predetermined electrical response upon absorption of a particular wavelength, typically in the IR or MIR region of the spectrum. Examples of photodetector devices including semiconductor nanocrystals are described in "A Quantum Dot Heterojunction Photodetector" by Alexi Cosmos Arango, Submitted to the Department of Electrical Engineering and Computer Science, in partial fulfillment of the requirements for the degree of Masters of Science in Computer Science and Engineering at the Massachusetts Institute of Technology, February 2005, the disclosure of which is hereby incorporated herein by reference in its entirety. One or more photodetectors can further be included in an imaging device, such as an hyperspectral imaging device. Sec, for example, U.S. Provisional Application No. 60/785,786 of Coe-Sullivan et al. for "Hyperspectral Imaging Device", filed 24 Mar. 2006, the disclosure of which is hereby incorporated herein by reference in its entirety.

In one embodiment, a method of fabricating a photodetector device includes depositing an in accordance with the an embodiment of the present invention onto a layer of the device from a micro-dispenser. In one embodiment, the nanomaterial comprises semiconductor nanocrystals. The ink can be deposited onto the layer of the device in a predetermined patterned arrangement or as an unpatterned arrangement, including, only by way of example, a layer, a continuous film, etc. Preferably the liquid vehicle is removed from the deposited ink before deposition of any other material or layer thereover.

In another embodiment, a method of fabricating an array of photodetector devices includes depositing an ink in accordance with an embodiment of the invention onto a layer of the device from a micro-dispenser. In one embodiment, the nanomaterial comprises semiconductor nanocrystals. The ink comprising a nanomaterial and a liquid vehicle can be deposited on the device layer in a predetermined arrangement (patterned or unpatterned). The device layer can be disposed on a substrate that further includes an electrode. A second electrode can be deposited over the deposited nanomaterial, preferably after removal of the liquid vehicle from the ink. In one embodiment, the device layer onto which the nanomaterial is deposited comprises a charge transport material. Optionally, a second charge transport layer can be formed between the nanomaterial layer and the second electrode.

A method of fabricating a photodetector device or array of devices can optionally include depositing one or more nanomaterials in a predetermined arrangement (patterned or unpatterned). As discussed above, an ink including a nanomaterial and a liquid vehicle is deposited from a micro-dispenser.

Methods in accordance with the invention can also be used in deposition nanomaterials in the fabrication of memory devices. An example of a nonvolatile device is described in U.S. patent application Ser. No. 10/958,659, for "Non-Volatile Memory Device", of Bawendi et al., filed 6 Oct. 2004, the disclosure of which is hereby incorporated herein by reference in its entirety.

For additional information relating to semiconductor nanocrystals and their use, see also U.S. Patent Application No. 60/620,967, filed Oct. 22, 2004, and Ser. No. 11/032, 163, filed Jan. 11, 2005, U.S. patent application Ser. No. 11/071,244, filed 4 Mar. 2005. Each of the foregoing patent applications is hereby incorporated herein by reference in its entirety.

As used herein, "top" and "bottom" are relative positional terms, based upon a location from a reference point. More particularly, "top" means furthest away from the substrate, while "bottom" means closest to the substrate. For example, for a light-emitting device that optionally includes two electrodes, the bottom electrode is the electrode closest to the substrate, and is generally the first electrode fabricated; the top electrode is the electrode that is more remote from the substrate, on the top side of the light-emitting material. The bottom electrode has two surfaces, a bottom surface closest to the substrate, and a top surface further away from the substrate. Where, e.g., a first layer is described as disposed or deposited "over" a second layer, the first layer is disposed further away from substrate. There may be other layers between the first and second layer, unless it is otherwise specified. For example, a cathode may be described as "disposed over" an anode, even though there are various organic and/or inorganic layers in between.

As used herein, the singular forms "a", "an" and "the" include plural unless the context clearly dictates otherwise. Thus, for example, reference to a nanomaterial includes reference to one or more of such materials.

All the patents and publications mentioned above and throughout are incorporated in their entirety by reference herein. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method for fabricating an optical components, comprising,
   depositing an ink composition comprising a nanomaterial and a non-polar organic solvent liquid vehicle over a substrate,
   wherein the nanomaterial comprises a plurality of quantum confined semiconductor nanocrystals, and
   wherein the nanomaterial has a solubility less than 0.001 milligrams per milliliter in the non-polar organic solvent liquid vehicle.

2. The method of claim 1,
   wherein the substrate comprises at least one of the other layers, and
   wherein the ink composition is deposited on the at least one of the other layers.

3. The method of claim 2,
   wherein the at least one of the other layers comprises an electrode.

4. The method of claim 1, further comprising
   removing the non-polar organic solvent liquid vehicle after the depositing.

5. The method of claim 1,
   wherein the ink composition is deposited in a patterned arrangement.

6. The method of claim 5,
   wherein the ink composition is deposited by using at least one of inkjet print heads and micro-dispensers, without using shadow masks.

7. The method of claim 5,
   wherein the optical components comprise an array of pixels.

8. The method of claim 5,
   wherein the patterned arrangement includes a plurality of patterns, and each of the patterns has a size less than 1 millimeter.

9. The method of claim 1,
   wherein the non-polar organic solvent liquid vehicle has a polarity relative to water of equal to or less than 0.404.

10. The method of claim 1,
    wherein the quantum confined semiconductor nanocrystal is dispersed within the non-polar organic solvent liquid vehicle.

11. The method of claim 10,
    wherein the quantum confined semiconductor nanocrystal is colloidally dispersed within the non-polar organic solvent liquid vehicle.

12. The method of claim 1,
    wherein the non-polar organic solvent liquid vehicle has a viscosity less than or equal to 1 centipoise.

13. The method of claim 1,
    wherein the ink composition includes at least about 50 milligrams of the quantum confined semiconductor nanocrystals per milliliter of the non-polar organic solvent liquid vehicle.

14. The method of claim 1,
    wherein the non-polar organic solvent liquid vehicle has a polarity relative to water of 0.006 to 0.355.

15. The method of claim 14,
    wherein the non-polar organic solvent liquid vehicle has a polarity relative to water of 0.006 to 0.207.

16. The method of claim 1,
    wherein the non-polar organic solvent liquid vehicle comprises cyclohexane, pentane, hexane, heptane, carbon tetrachloride, p-xylene, toluene, benzene, dimethyl ether, methyl t-butyl alcohol, dioxane, tetrahydrofuran, ethyl acetate, dimethoxy-ethane, diglyme, chloroform, 2-butanone, acetone, t-butyl alcohol, decane, dodecane, carbon tetrachloride, ethylbenzene, octane, anisole, or perfluorodecalin.

17. A method for fabricating a light-emitting device comprising:
    preparing a substrate;
    forming a first electrode on the substrate;
    depositing a first layer deposited on the first electrode, the first layer comprising a first material capable of transporting holes;
    forming an emissive layer on the first layer by depositing an ink composition comprising a nanomaterial and a non-polar organic solvent liquid vehicle,
    depositing a second layer on the emissive layer, wherein the second layer the comprises a second material capable of transporting electrons; and
    forming a second electrode deposited on the second layer,
    wherein the nanomaterial comprises a plurality of quantum confined semiconductor nanocrystals, and
    wherein the nanomaterial has a solubility less than 0.001 milligrams per milliliter in the non-polar organic solvent liquid vehicle.

18. The method of claim 17,
    wherein the non-polar organic solvent liquid vehicle has a polarity relative to water of equal to or less than 0.404.

19. The method of claim 17,
    wherein the nanomaterial comprises one or more ligands attached to a surface of at least a portion of the quantum confined semiconductor nanocrystal.

20. The method of claim 19,
    wherein the ligands are represented by the chemical formula:

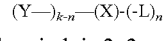

wherein k is 2, 3 or 5, and n is 1, 2, 3, 4 or 5 such that k-n is not less than zero;
    X is O, S, S=O, SO$_2$, Se, Se=O, N, N=O, P, P=O, As, or As=O;
    each of Y and L, independently, is aryl, heteroaryl, or a straight or branched C2-12 hydrocarbon chain optionally containing at least one double bond, at least one triple bond, or at least one double bond and one triple bond,
    wherein the hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl, and wherein the hydrocarbon chain can also be optionally interrupted by —O—, —S—, —N(R,)—, —N(Ra)-C(O)—O—, —O—C(O)—N(Ra)-, —N(R,,)—C(O)—N(Rb)-, —O—C(O)—O—, —P(Ra)—, or —P(O)(Ra)-, and wherein each of Ra and Rb, independently, is hydrogen, alkyl, alkenyl, alkynyl, alkoxy, hydroxylalkyl, hydroxyl, or haloalkyl.

21. The method of claim 17,
wherein at least a portion of the quantum confined semiconductor nanocrystals comprises a core/shell structure.

22. The method of claim 17,
wherein the emissive layer has patterned regions.

23. The method of claim 17,
wherein the first layer comprises a small molecule material.

24. The method of claim 17,
wherein the quantum confined semiconductor nanocrystal is dispersed within the non-polar organic solvent liquid vehicle.

25. The method of claim 17,
wherein the quantum confined semiconductor nanocrystal is colloidally dispersed within the non-polar organic solvent liquid vehicle.

26. The method of claim 17,
wherein the non-polar organic solvent liquid vehicle has a viscosity less than or equal to 1 centipoise.

27. The method of claim 17,
wherein the ink composition includes at least about 50 milligrams of the quantum confined semiconductor nanocrystals per milliliter of the non-polar organic solvent liquid vehicle.

28. The method of claim 17, wherein the non-polar organic solvent liquid vehicle has a polarity relative to water of 0.006 to 0.355.

29. The method of claim 17, wherein the non-polar organic solvent liquid vehicle has a polarity relative to water of 0.006 to 0.207.

30. The method of claim 17, wherein the non-polar organic solvent liquid vehicle comprises cyclohexane, pentane, hexane, heptane, carbon tetrachloride, p-xylene, toluene, benzene, dimethyl ether, methyl t-butyl alcohol, dioxane, tetrahydrofuran, ethyl acetate, dimethoxy-ethane, diglyme, chloroform, 2-butanone, acetone, t-butyl alcohol, decane, dodecane, carbon tetrachloride, ethylbenzene, octane, anisole, or perfluorodecalin.

* * * * *